(12) United States Patent
Tseng et al.

(10) Patent No.: US 8,571,828 B2
(45) Date of Patent: Oct. 29, 2013

(54) METHOD AND COMPUTER READABLE MEDIA FOR DETERMINING ORIENTATION OF FIBERS IN A FLUID

(75) Inventors: Huan Chang Tseng, Hsinchu (TW); Rong Yeu Chang, Hsinchu (TW); Chia Hsiang Hsu, Hsinchu County (TW)

(73) Assignees: Coretech Systems Co., Ltd., Hsinchu County (TW); Molecular Dynamics Technology Co. Ltd., Hsinchu County (TW)

( * ) Notice: Subject to any disclaimer, the term of this patent is extended or adjusted under 35 U.S.C. 154(b) by 180 days.

(21) Appl. No.: 13/168,211

(22) Filed: Jun. 24, 2011

(65) Prior Publication Data

US 2012/0330627 A1 Dec. 27, 2012

(51) Int. Cl.
*G01C 9/00* (2006.01)
*G01N 11/00* (2006.01)
*G06G 7/50* (2006.01)

(52) U.S. Cl.
USPC .............................. 702/150; 73/53.01; 703/9

(58) Field of Classification Search
USPC ............. 702/150, 41–43, 127, 153, 189, 196; 703/2, 9; 73/53.01, 61.41
See application file for complete search history.

(56) References Cited

U.S. PATENT DOCUMENTS 7,266,469 B1 9/2007 Tucker, III et al.

OTHER PUBLICATIONS

Rahnama et al., The Effect of Hydrodynamic Interactions on the Orientation Distribution in a Fiber Suspension Subject to Simple Shear Flow, Mar. 1995, Phys. Fluids 7 (3), pp. 487-506.*
C. L. Tucker, III and H. M. Huynh, presented at the Proceedings of the 17th Annual Meeting of the Polymer Processing Society, Montreal, Quebec, Canada, 2001 (unpublished), 6 pp.
J. Wang, J. F. O'Gara, and C. L. Tucker III, An Objective Model for Slow Orientation Kinetics in Concentrated Fiber Suspensions: Theory and Rheological Evidence, J. Rheol. 52, 1179 (2008), 22 pp.
K. C. Ortman, N. Agarwal, D. G. Baird, P. Wapperom, and A. J. Giacomin, presented at the Macromolecules and Interfaces Institute Technical Conference and Review, Blacksburg, Virginia, USA, 2010 (unpublished), 1 pp.
J. H. Phelps, Processing-Microstructure Models for Short- and Long-Fiber Thermoplastic Composites, University of Illinois at Urbana-Champaign (2009), 216 pp.
J. H. Phelps and C. L. Tucker III, An Anisotropic Rotary Diffusion Model for Fiber Orientation in Short- and Long-Fiber Thermoplastics, J. Non-Newtonian Fluid Mech. 156 165 (2009), 12 pp.

(Continued)

*Primary Examiner* — Toan Le
(74) *Attorney, Agent, or Firm* — WPAT, P.C.; Anthony King

(57) ABSTRACT

One aspect of the present invention provides a method for determining orientation of fibers in a fluid having polymer chains, characterized in that the determining of the orientation of the fibers is performed by taking into consideration an interaction between the fibers and the fluid, wherein the interaction between the fibers and the fluid comprises changes in configuration of the polymer chain to cause the entanglement or adsorption between the fibers and the polymer chains. Another aspect of the present invention provides a method for determining orientation of fibers in a fluid having polymer chains, the fibers in the fluid including a transitional movement and a rotatory movement, the method being characterized in that the determining of the orientation of the fibers is performed by taking into consideration a steric barrier effect on a rotary movement of the fibers.

26 Claims, 22 Drawing Sheets

(56) References Cited

OTHER PUBLICATIONS

N. Nguyen, X. Jin, J. Wang, J. H. Phelps, C. L. Tucker III, V. Kunc, S. K. Bapanapalli, and M. T. Smith, Implementation of New Process Models for Tailored Polymer Composite Structures into Processing Software Packages, the U.S. Department of Energy, Pacific Northwest National Laboratory, under Contract DE-AC05-76RL01830; (2010), 48 pp.

J. F. O'Gara, M. G. Wyzgoski, and G. E. Novak, presented at the Proceedings of the 61th Annual Technical Conference and Exhibition, SPE ANTEC 2003, Nashville, Tennessee, U.S.A., 2003 (unpublished), 5 pp.

G. L. Hand, A Theory of Anisotropic Fluids, J. Fluid Mech. 13, 33 (1962), 14 pp.

P. J. Hine, N. Davidson, R. A. Duckett, A. R. Clarke, and I. M. Ward., Hydrostatically Extruded Glass-Fiber Reinforced Polyoxymethylene. I. The Development of Fiber and Matrix Orientation, Polymer Composites 17, 720 (1996), 10 pp.

G. B. Jeffery, The Motion of Ellipsoidal Particles Immersed in a Viscous Fluid, Proc. R. Soc. A 102, 161 (1922), 20 pp.

M. Keshtkar, M.-C. Heuzey, P. J. Carreau, M. Rajabian, and C. Dubois, Rheological Properties and Microstructural Evolution of Semi-Flexible Fiber Suspensions under Shear Flow, J. Rheol. 54, 197 (2010), 26 pp.

S. G. Advani and C. L. Tucker III, The Use of Tensors to Describe and Predict Fiber Orientation in Short Fiber Composites, J. Rheol. 31, 751 (1987), 34 pp.

A. P. R. Eberle, D. G. Baird, P. Wapperom, and G. M. Vélez-García, Using Transient Shear Rheology to Determine Material Parameters in Fiber Suspension Theory, J. Rheol. 53, 685 (2009), 21 pp.

B. E. VerWeyst, Numerical Predictions of Flow-Induced Fiber Orientation in Three-Dimensional Geometries, University of Illinois at Urbana-Champaign (1998), 255 pp.

F. Folgar and C. L. Tucker III, Orientation Behavior of Fibers in Concentrated Suspensions, J. Reinf. Plast. Compos. 3, 98 (1984), 23 pp.

R. Byron Bird et al., Transport Phenomena, Tensor Operations in Terms of Components, p. 817, Section A 3, 2001.

J. Wang, Improved Fiber Orientation Predictions for Injection Molded Composites, University of Illinois at Urbana-Champaign (2007), 161 pp.

Search Report from counterpart EP application 12164727.5 dated Aug. 22, 2013.

Rajabian, Mahmoud et al., Suspensions of Semiflexible Fibers in Plymeric Fluids:Rheology and Thermodynamics, Rheoloica Acta, Jul. 2005, pp. 521-535, vol. 44, No. 5.

Shvartzman-Cohen, Rina et al., Selective Dispersion of Single-Walled Carbon Nanotubes in the Presence of Polymers: the Role of Molecular and Colloidal Length Scales, Journal of the American Chemical Society, Nov. 17, 2004, pp. 14850-14857, vol. 126, No. 45.

Rajabian, Mahmoud et al., Rheology and Flow Behavior of Suspensions of Nanosized Plate-Like Particles in Polyester Resins at the Startup of Shear Flows: Experimental and Modeling, Polymer Composites Society of Plastics Engineers Inc., Apr. 2009, pp. 399-407, vol. 30, No. 4.

Rahnama, Mani et al., The Effect of Hydrodynamic Interaction so n the Orientation Distribution in a Fiber Suspension Subject to Simple Shear Flow, Physics of Fluids, Mar. 1995, pp. 487-506, vol. 7, No. 3.

Litchfield, D.W. et al., The Rheology of High Aspect Ration Nano-Particle Filled Liquids, Rheology Reviews, Jan. 1, 2006, pp. 1-60.

* cited by examiner

METHOD AND COMPUTER READABLE MEDIA FOR DETERMINING ORIENTATION OF FIBERS IN A FLUID

BACKGROUND OF THE INVENTION

1. Technical Field

The present invention relates to a method and a computer readable media for determining orientation of fibers in a fluid.

2. Background

Man-made fiber-reinforced thermoplastic (FRT) composites are widely-known materials in polymer engineering technology, with various techniques of injection molding and extrusion being commonly used. The advantages of light weight, high performance, low production cost and good recyclability make FRT composites preferred options to replace metals and thermoset composites. Such FRT materials have improved mechanical properties, including tensile property, thermal expansion, electrical conductivity, and water penetrability.

FRT composites are grouped into two categories based on fiber length: short fiber-reinforced thermoplastics or SFRTs, with fiber length of about 0.2 to 0.4 mm, and long fiber-reinforced thermoplastics or LFRTs, having fiber length of about 10 to 13 mm. Unlike SFRTs, LFRTs can yield continuous-fiber reinforcement. LFRT pellets are more extensively employed in automotive industrial fabrication than SFRT pellets.

FIG. 1 illustrates an injection molding apparatus 10 and a mold unit 20 according to the prior art. The injection molding apparatus 10 includes a screw chamber 11, a heating element 13 configured to heat the screw chamber 11, and a screw 15 positioned in the screw chamber 11. The mold unit 20 includes a sprue 21, a runner 23 and cavities 25. The injection molding apparatus 10 is configured to inject molding material into the cavity 25 of the mold unit 20. The injection molding technique uses conventional rapid automated molding equipment. SFRT/LFRT production has been applied using the injection process. In the injection process, the additional fiber composites filled in polymer/resin melts are transported as a suspension into the mold cavity 25. To design products effectively, the influence of flow-induced fiber orientation distribution on the properties of the finished part must be considered. The effect of divergent/convergent channels of the mold cavity 25 on the alignment of the fibers 30 is clearly illustrated in FIG. 2A and FIG. 2B.

FIG. 3 illustrates the orientation of fibers in the mold cavity 25. The most noticeable feature of the filling is the existence of a shell region 31 and a core region 33 across the thickness of the molded cavity 25. The fibers found in the shell region 31 (near the cavity wall) are strongly aligned in the flow direction, but the fibers in the core region 33 (near the cavity center) are transverse to the flow. Hence, it is necessary to understand how the fiber orientation varies during the mold filling.

Fiber suspension rheology is a highly developed and crucial component of processing technology. Fiber orientation technology is based on Jeffery's time evolution equation for the motion of an isolated rigid spheroid immersed in a Newtonian fluid (see, G. B. Jeffery, "The Motion of Ellipsoidal Particles Immersed in a Viscous Fluid," Proc. R. Soc. A 102, 161 (1922)). The significant orientation of the Jeffery theory is due to the flow-induced hydrodynamics in dilute suspension.

For a concentrated fiber suspension, Folgar and Tucker (see, F. Folgar and C. L. Tucker III, Orientation Behavior of Fibers in Concentrated Suspensions, J. Reinf. Plast. Compos. 3, 98 (1984)) construed an Isotropic Rotary Diffusion Model that was essentially added to Jeffery's equation of the fiber hydrodynamic term. Subsequently, Advani and Tucker (see, S. G. Advani and C. L. Tucker III, "The use of tensors to describe and predict fiber orientation in short fiber composites," J. Rheol. 31, 751 (1987)) suggested a second moment tensor, averaged over probability space, to describe the orientation state in surface spherical coordinates. Thus, the well-known Folgar-Tucker time-evolution equation of the orientation tensor, which includes both the Jeffery hydrodynamics and the isotropic rotary diffusion terms, is obtained. The Folgar-Tucker orientation equation family has been implemented in almost all commercial software programs for injection molding.

Under recent rheological experiments of transient shear flow for short fiber suspension, FIG. 4 shows the flow directional orientation against shear strain for the measured orientation data (see, A. P. R. Eberle, D. G. Baird, P. Wapperom, and G. M. Vélez-García, "Using transient shear rheology to determine material parameters in fiber suspension theory", J. Rheol. 53, 685 (2009)) and the orientation prediction by the Folgar-Tucker (FT) Equation. As focusing in a transient region (about strain <50), a critical problem is that the predicted transient rate of orientation is quicker than the experimental measurements. Hence, it is necessary to develop am improvement of the FT Equation for acceptably predicting fiber orientation (see, J. Wang, J. F. O'Gara, and C. L. Tucker III, An Objective Model for Slow Orientation Kinetics in Concentrated Fiber Suspensions: Theory and Rheological Evidence, J. Rheol. 52, 1179 (2008)).

For the prediction of fiber orientation in injection molding, the fiber-reinforced parts have become standard components of the prediction calculation. Previously, Tucker and Huynh (see, C. L. Tucker III and H. M. Huynh, "Fiber orientation in short flow length parts: limitations of current predictions," presented at the Proceedings of the 17th Annual Meeting of the Polymer Processing Society, Montreal, Quebec, Canada, 21-24 May, 2001) reported that significant differences between the Folgar-Tucker prediction and experimental observations arise when the flow length of injection molding is short (approximate length/thickness <50). That is, the thickness of the core in practice is found to be greater than the predicted thickness of the core. This is not an acceptable prediction.

The urgent problem above was resolved by Tucker, Wang, and O'Gara, who proposed an innovative model, the Reduced Strain Closure (RSC) Model (see, C. L. Tucker III, J. Wang, and J. F. O'Gara, "Method and article of manufacture for determining a rate of change of orientation of a plurality of fibers disposed in a fluid", U.S. Pat. No. 7,266,469 B1 (2007)). Significantly, Tucker et al. employed a scalar factor κ to reduce the rate of eigenvalues of orientation tensor while the rate of eigenvectors is unchanged. The RSC Model raises two necessary fourth order tensors, consisting of the eigenvalues and the eigenvectors. The scalar factor κ effectively reduces the rate of change of fiber orientation due to the deformation and the diffusion of the fibers and the fluid, but does not affect the rigid body rotation. Thus, the RSC Model is confirmed to have frame indifference objectivity for a wide class of flows.

The studies mentioned above are suited only to short fibers. In equilibrium states, the short fiber orientation is assumed to be random isotropic, but the long fiber orientation is anisotropic. More Recently, Phelps and Tucker (see, J. H. Phelps and C. L. Tucker III, "An anisotropic rotary diffusion model for fiber orientation in short- and long-fiber thermoplastics," J. Non-Newtonian Fluid Mech. 156 165 (2009)) proposed a two-dimensional diffusion tensor in surface spherical coordinates to obtain an anisotropic rotary diffusion (ARD) orientation equation for long fibers.

For long fiber composites, therefore, the ARD Model, combined with the RSC Model, is referred to as an ARD-RSC Model with six parameters. The ARD-RSC Model has been implemented in commercial software programs for injection molding. Unfortunately, the ARD-RSC Model is not easy to apply because the parameters are so sensitive and cannot be exactly determined. Inappropriate parameter values may cause poor divergence results. No logistics criterion or experiential rule to adjust the six parameters has been proposed, yet. Nevertheless, Phelps and Tucker further offered a program to fit experimental data and obtained many possible sets of parameters. However, such a program is somewhat complicated and inconvenient to use.

Furthermore, the fact that polymer fluids flow in the injection molding process is considered. After being transported into mold cavity and then cease, the fluids are suddenly solidified via cooling system. According to polymer rheology, the rested fluids' velocity vector and the velocity gradient tensor (L) go to zero, while their vorticity tensor (W) and rate-of-deformation tensor (D) to be zero is due to $W=\frac{1}{2}(L-L^t)$ and $D=\frac{1}{2}(L+L^t)$, wherein $L^t$ is a transpose matrix of L.

At this point, such fluids consisting of polymer chains should exist in non-equilibrium thermodynamics states and possess residual stresses for themselves. With respect to time, the stress is spontaneously released, up to the chains approaching a quasi-equilibrium state of random coil. This conforms to a prevalent understanding of polymer viscoelasticity.

Prior to suspension rheological theories, the Jeffery hydrodynamic model $\dot{A}_{HD}^J$ and the Folgar-Tucker diffusion model are classic to study regarding changes in orientation states of fibers immersed in fluids. In recent, the RSC Model $\dot{A}^{RSC}$ developed by Tucker and coworkers is attended in application of orientation prediction to injection molding. As a premise, these models assume fluids of interest to be the Newtonian fluid, wherein their details are available elsewhere (see, J. Wang, J. F. O'Gara, and C. L. Tucker III, An Objective Model for Slow Orientation Kinetics in Concentrated Fiber Suspensions: Theory and Rheological Evidence, J. Rheol. 52, 1179 (2008)). Regrettably, the significant models have not been attempted to discuss, especially in a rested fluid situation, changes in fiber orientation. Thus, $\dot{A}_{HD}^J=\dot{A}_{DF}^{FT}=\dot{A}^{RSC}=0$ go to zero in which the flow ceases and their vorticity tensor, rate-of-deformation tensors, and strain rate all equal to zero. This finding indicates no contribution to the change of fiber orientation. In short, applying these aforementioned models based on the Newtonian fluid assumption, changes in orientation of fibers existing in the rested fluids, particularly when configuration variations of polymer chains is due to relaxation of residual stress, should not have been described.

SUMMARY

One aspect of the present invention provides a method for determining orientation of fibers in a fluid having polymer chains, characterized in that the determining of the orientation of the fibers is performed by taking into consideration an interaction between the fibers and the fluid, wherein the interaction between the fibers and the fluid comprises changes in configuration of the polymer chain to cause the entanglement or adsorption between the fibers and the polymer chains.

Another aspect of the present invention provides a method for determining orientation of fibers in a fluid having polymer chains, the fibers in the fluid including a transitional movement and a rotary movement, the method being characterized in that the determining of the orientation of the fibers is performed by taking into consideration a steric barrier effect on a rotary movement of the fibers.

A father aspect of the present invention provides a computer readable media having a computer program encoded therein for determining orientation of fibers in a fluid having polymer chains, characterized in that the determining of the orientation of the fibers is performed by taking into consideration an interaction between the fibers and the fluid, wherein the interaction between the fibers and the fluid comprises changes in configuration of the polymer chain to cause the entanglement or adsorption between the fibers and the polymer chains.

A father aspect of the present invention provides a computer readable media having a computer program encoded therein for determining orientation of fibers in a fluid having polymer chains, the fibers in the fluid including a transitional movement and a rotary movement, the method being characterized in that the determining of the orientation of the fibers is performed by taking into consideration a steric barrier effect on a rotary movement of the fibers.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

Considering the fluids of interest is referred to as non-Newtonian fluids having polymer chains. The fluids are viscoelastic and their polymer chains are entanglement. Such an assumption is close to a general fact for fibers immersed in polymer matrix. Furthermore, considering the interaction between the fibers and the fluid affecting the fiber orientation, the fibers are entwined by the polymer chains or adsorbed into the polymer chains. As this interaction exists, intrinsic changes in configuration of the polymer chain structure induce incidental changes in fiber orientation. Therefore, both considerations are obviously different to the previous fiber orientation models mentioned above. After deriving with details, it is significant to obtain a new tensor $\dot{A}_{FM}^{RPR}$, which is referred to as the Retarded Principal Rate (RPR) model based on the Intrinsic Orientation Kinetic (IOK) mechanism.

Moreover, the stress relaxation and the creeping are well-known in mechanic testes of polymer materials. Due to existence of the fiber-fluid interaction in the suspension system, influence of both testes on fiber orientation is physically explained, as follows:

(i) Stress Relaxation

The rested fluids with zero values of the velocity and velocity gradient tensor still remain the residual stress. As the stress releases with respect to time, the degree of the fibers restricted by the polymer chains decreases so that the fiber orientation varies correspondingly.

(ii) Creeping

The rested fluid is solidified and then is loaded by a constant stress. For a long time, the fluid undergoes a history of elongation deformation, which is known as the creeping process. Thereby, the polymer chains strongly stretched and aligned, while the fiber orientation changes correspondingly.

In brief, the intrinsic changes in chain configuration significantly influence incidental changes in fiber orientation, as drawing from the non-Newtonian fluid and the fiber-matrix interaction.

Thus far, the fiber-matrix interaction (the interaction between the fibers and the polymer chains of the fluid) hypothesis has not been fairly considered in the fiber orientation model of suspension rheological theory. The premise of the present invention that a fiber is a rigid rod without any deformation is merely assumed. The present invention provides a Retarding Principal Rate (RPR) Model that would induce a novel slow orientation kinetic mechanism in the fiber-matrix interaction. The RPR Model should be established with a rigorous theoretical framework for suspensions in intrinsic orientation kinetics. The advantage of this invention is that an additional term of the fiber-matrix interaction is taken into consideration in determining orientation of fibers in a fluid.

Figure 1:
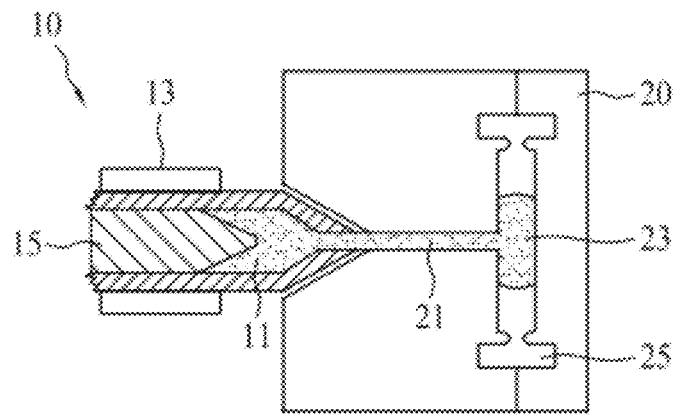
FIG. 1 illustrates an injection molding apparatus and a mold unit according to the prior art.
Figure 2A:
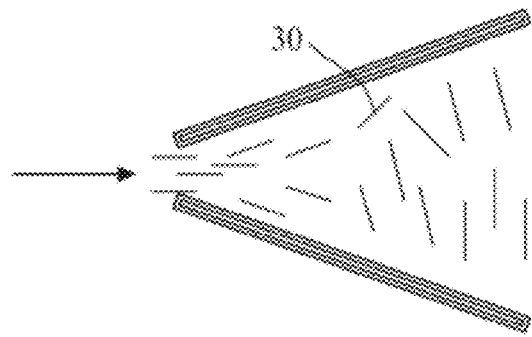
FIG. 2A and FIG. 2B show the effect of divergent/convergent channels of the mold cavity on the alignment of the fibers, respectively.
Figure 2B:
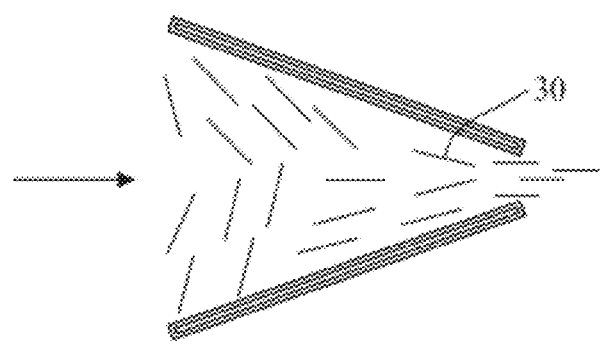
Figure 3:
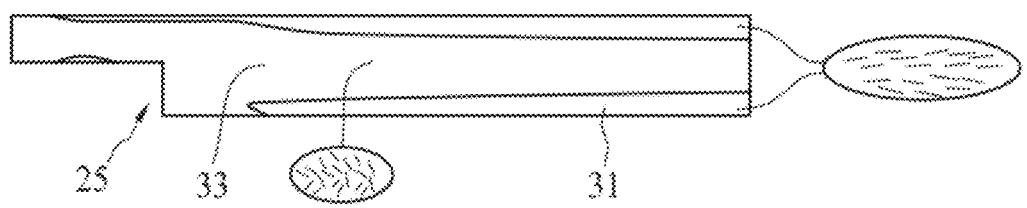
FIG. 3 illustrates the orientation of fibers in the mold cavity.
Figure 5:
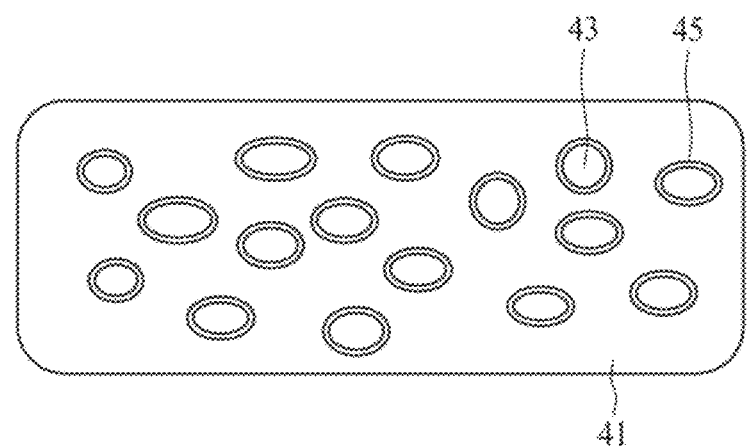
FIG. 5 shows a mixture of polymer matrix, fiber, and coupling agent at the macroscopic level according to the prior art.
Figure 4:
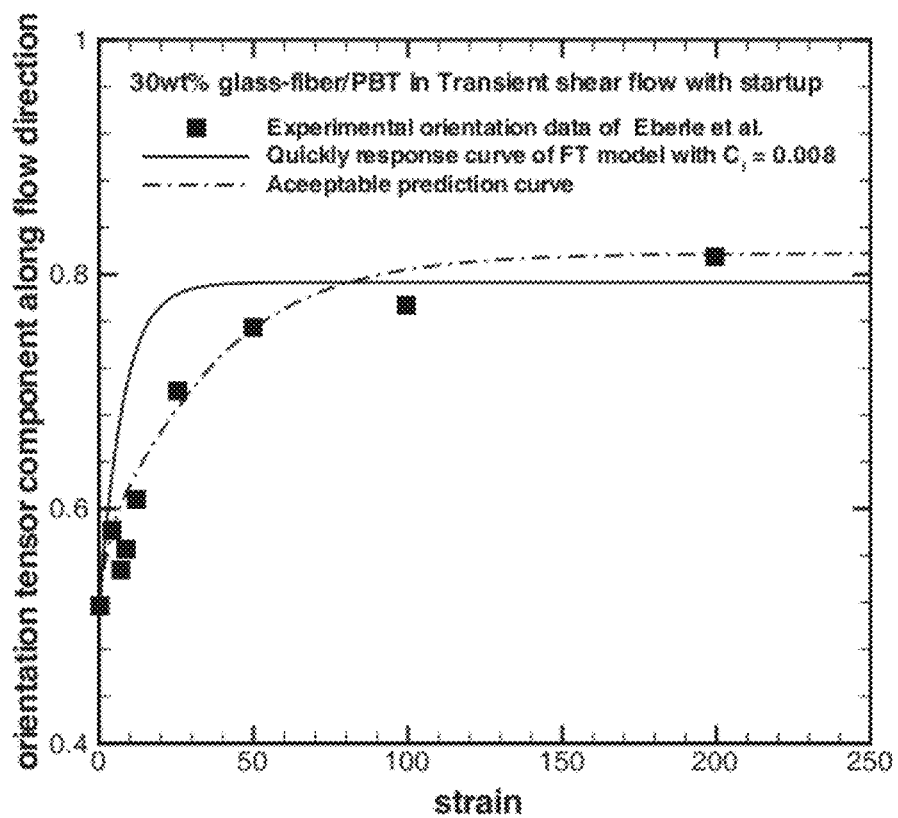
FIG. 4 shows the predicted transient rate of fiber orientation according to the prior art.
Figure 6:
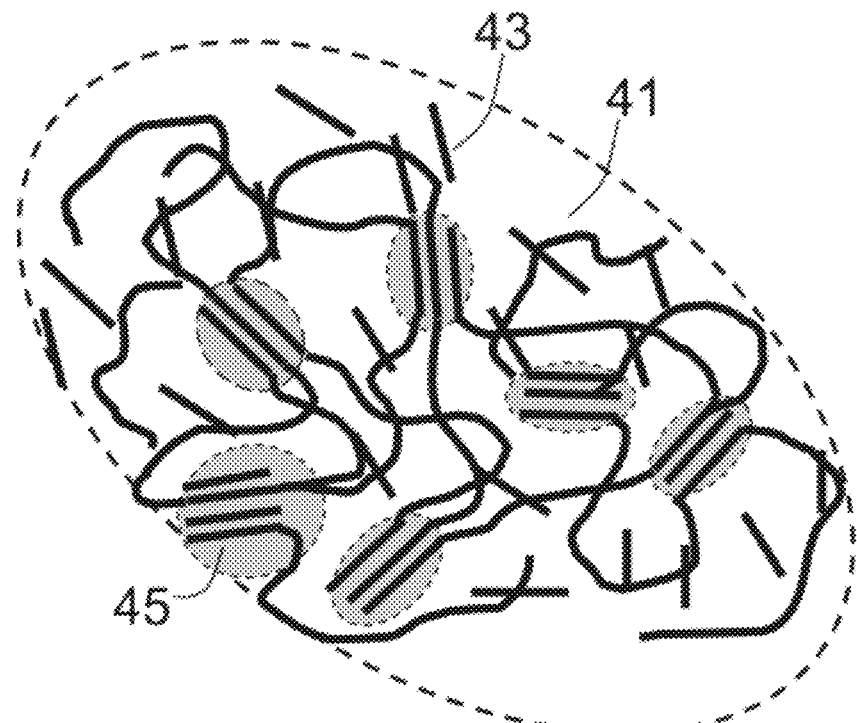
FIG. 6 shows a mixture of partial aligned polymer chains, fibers, and coupling agents at the microscopic level according to the prior art.

In a macroscopic view, a "fiber-reinforced composite" refers to as a material containing fibers embedded in a matrix with well-defined interfaces between two constitutive phases. At a macroscopic level, as shown in FIG. 5, the coupling agents 45 are small difunctional molecules acting as a bridge between the fibers 43 and the fluid (matrix) 41. If necessary, these additional coupling agents can be added to strengthen the cohesion between the inorganic fiber and organic polymer. At a microscopic level, FIG. 6 represents a mixture that exists in the practical suspension where the fibers 43 are immersed in a matrix of partial aligned polymer chains 41 by adding a small amount of the coupling agent 45. The coupling agent 45 is an interface medium between the fibers 43 and the polymer chains 41. The long polymer chains are an entanglement. Very probably, the fibers 43 are also entwined by the chains or adsorbed into the chains 41 through the coupling agent 45.

In the present invention, particularly for the rested polymer fluids, it is very important that the partial aligned polymer chains, at a non-equilibrium state of mechanics, intrinsically possesses a strong residual stress distribution, while the stress spontaneously relaxes up to the chains approaching a quasi-equilibrium state of random coil. In this situation, the aligned fibers with a high order may be compelled to transition to a slight orientation or near random state during the relaxation process of the chains.

In order to reduce the transient rate of orientation, the modeling strategy focuses on the fiber-matrix interaction due to the relaxation of the polymer chains for the fluid/matrix. Nevertheless, the additional interaction model is considered in the equation of continuity which makes a rational explanation possible. One should be able to demonstrate the existence of the fiber-matrix interaction in descriptive adequacy regarding the kinetic inference and the thermodynamic objective, and then must substantially build a proper model.

In following sections, the details of the first method of the present invention are focused concerning the kinetic inference, thermodynamic objective, molding strategy, and embodiment model. Last, the second method of the present invention provides a method for determining orientation of, particularly, long fibers in a fluid, wherein the anisotropic rotary diffusion tensor of fiber is critical. The idea of the second method of the present invention is described below, as drawing from the conventional isotropic rotary diffusion tensor integrated with a dimensionless flow resistance tensor.

1. Kinetic Inference

Figure 7:
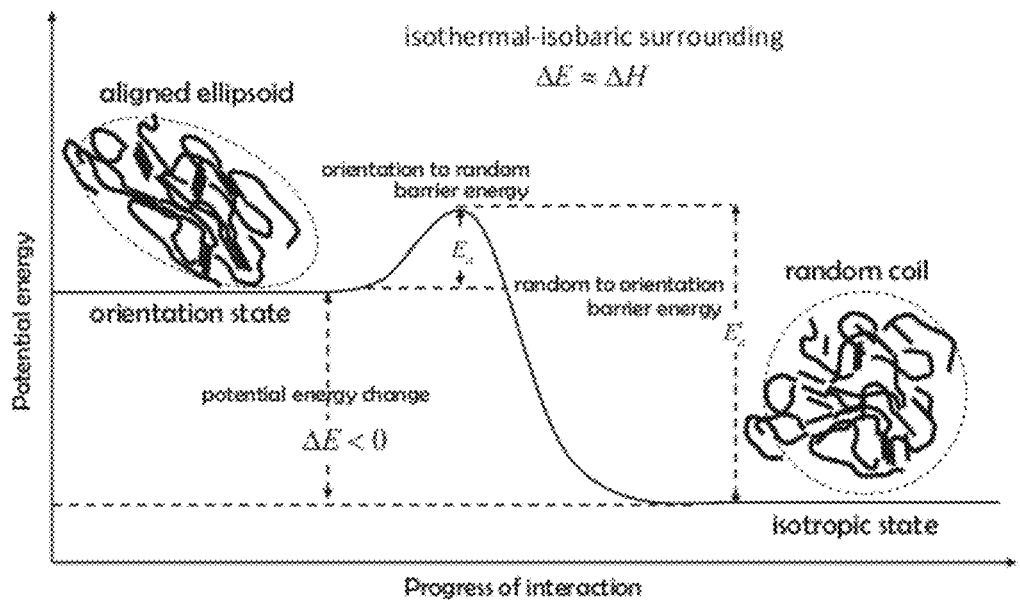
FIG. 7 shows a slow orientation kinetic mechanism of fiber suspensions: the aligned-to-random process and the random-to-aligned process.

Simply put, one can treat only a binary mixture system of fibers and polymer chains without a coupling agent. FIG. 7 illustrates that the orientation kinetic physical picture for the mixture is the potential energy against the progress of interaction. There are two significant orientation-to-random and random-to-orientation processes in this representation. The shape of the mixture in an orientation state is an aligned ellipsoid with a higher potential energy, but in an isotropic state it is a random coil with a lower stable potential energy. Simultaneously, the orientation-to-random barrier energy is smaller than the random-to-orientation process, $E_a \ll E_a'$. In other words, the incidence of the orientation-to-random process is greater than the random-to-orientation process.

Thus, the orientation-to-random process tends to gradually decrease the probability of finding certain aligned fibers. One can assume that the slow orientation kinetics may be related to the intrinsic relaxation of the polymer chains, spontaneously, from an alignment state to random distribution. One may assume the Intrinsic Orientation Kinetic (IOK) to be a decay history mechanism dependent of the probability density function $\psi(p)$.

In nature, the first order decay mechanism is common. For this reason, the IOK mechanism of the function $\psi(p)$ can be modeled as follows:

$$\left[\frac{d\psi}{dt}\right]^{IOK} = -k\psi, \tag{1}$$

where the material derivative of probability density for the IOK Mechanism Model, $$\left[\frac{d\psi}{dt}\right]^{IOK},$$

indicates that the probability of aligned fibers decays with respect to time; k is a characteristic constant of the fiber-matrix interaction from an alignment state to random distribution. Notably, such a constant is dependent on mechanic processes of creeping and stress relaxation for polymer fluids, as well as polymer structures and fluid PVT (Pressure-Volume-Temperature) states. The amount, species, and length of fibers also influence the constant k.

In the present invention, particularly for the rested polymer fluids, it is very important that the partial aligned polymer chains, at a non-equilibrium state of mechanics, intrinsically possesses a strong residual stress distribution, while the stress spontaneously relaxes up to the chains approaching a quasi-equilibrium state of random coil. In this situation, the aligned fibers with a high order may be compelled to transition to a slight orientation or near random state during the relaxation process of the chains.

2. Thermodynamic Objective

A thermodynamic system is found in an isothermal-isobaric surrounding. Referring to FIG. 7, the difference in potential energy from an orientation state to a random state is negative, $\Delta E < 0$, while the entropy is enhanced, $\Delta S > 0$. It is assumed that $\Delta E$ is close to the change in enthalpy, $\Delta H$. The change in Gibbs free energy is $\Delta G = \Delta H - T\Delta S$. The temperature is positive, $T > 0$. $\Delta H < 0$ and $\Delta S < 0$, $\Delta G < 0$ indicates a spontaneous process for the orientation-to-random process of fibers, meaning a thermodynamic objective.

3. Modeling Strategy

However, the key issue to be resolved is finding the characteristic constant of fiber-matrix interaction, k. Obviously, the constant, k, is the inverse of the time-unit. Based on mechanical understanding, such a constant may imply the apparent rate of strain, namely, the total of all components of a certain dimensionless characteristic rate-of-strain tensor.

To model the deduction above, one can consider a single fiber's orientation tensor, pp, to define the constant, k, as follows:

$$k \equiv (pp)^{-1} : \left[\frac{d\,pp}{dt}\right]^{IOK}, \quad (2)$$

where the tensor $(pp)^{-1}$ is inverse of the tensor pp and $$\left[\frac{d\,pp}{dt}\right]^{IOK}$$

is a certain unknown material derivative of the tensor pp in the IOK mechanism.

The tensor, pp, is a symmetric matrix. In linear algebra, the orthogonal similarity transformation of a symmetric matrix is employed widely in areas of science and engineering. Therefore, the similarity transformation of tensor, pp, is described as:

$$pp = R_{pp} \cdot \Lambda_{pp} \cdot R_{pp}^t, \quad (1)$$

where $\Lambda_{pp}$ and $R_{pp}$ are the diagonal and rotation matrices of pp; $R_{pp}^t$ is the transpose matrix of the matrix $R_{pp}$; there is an orthogonal property: $R_{pp} \cdot R_{pp}^t = R_{pp}^t \cdot R_{pp} = I$. Inversely, the diagonalization of the tensor pp is $$\Lambda_{pp} = R_{pp}^t \cdot pp \cdot R_{pp}. \quad (2)$$

Multiplying the left and right sides of Eq. (1) by the tensor, pp, and integrating over orientation vector space, p, in the surface spherical coordinate, the equation can be arranged by inserting Eq. (2), as follows:

$$\frac{d}{dt}\oint \psi(p)pp\,dp = \quad (5)$$
$$-\oint pp\dot{\gamma}_a\psi(p)dp = -\oint \psi(p)\left[(pp)\otimes(pp)^{-1} : \left(\frac{d\,pp}{dt}\right)^{IOK}\right]dp.$$

One further applies a product rule of second order tensors to the equation above:

$$X \otimes Y : Z = XYZ, \quad (6)$$

where X, Y, and Z are second order tensors, the operator "$\otimes$" is the tensor-product and the operator ":" is the double-dot-product. Thereby, the integrated part of Eq. (5) is reduced to:

$$(pp)\otimes(pp)^{-1} : \left(\frac{d\,pp}{dt}\right)^{IOK} = [(pp)(pp)^{-1}]\left(\frac{d\,pp}{dt}\right)^{IOK} = \quad (7)$$
$$(I)\left(\frac{d\,pp}{dt}\right)^{IOK} = \left(\frac{d\,pp}{dt}\right)^{IOK}.$$

Notably, by using the similarity transformation based on the rotation matrix, $R_{pp}$, of tensor, pp, we find that:

$$\left(\frac{d\,pp}{dt}\right)^{IOK} = R_{pp} \cdot \dot{\Lambda}_{pp}^{IOK} \cdot R_{pp}^t, \quad (8)$$

where $\dot{\Lambda}_{pp}^{IOK}$ is a rate of the diagonal tensor of tensor pp in the IOK assumption.

Eq. (5) is rewritten as:

$$\frac{d}{dt}\oint \psi(p)pp\,dp = -\oint \psi(p)\left[R_{pp} \cdot \dot{\Lambda}_{pp}^{IOK} \cdot R_{pp}^t\right]dp. \quad (9)$$

According to the definition of the orientation tensor, A, its similarity transformation is given by $$A = R \cdot \Lambda \cdot R, \quad (3)$$

where $\Lambda$ and R are the diagonal matrix and rotation matrix, respectively; $R^t$ is the transpose of the matrix R. This rotation matrix is also an orthogonal matrix, $R \cdot R^t = R^t \cdot R = I$. Note that the components of the matrix $\Lambda$ are given the eigenvalues of the tensor A, $\Lambda_{ii} = \lambda_i$, and the matrix R is defined by the eigenvectors of the tensor A, $R = [e_1, e_2, e_3]$.

Using the rotation matrix, the similarity transformation of the material derivative of the orientation tensor can be expressed by $$\dot{A} = R \cdot \dot{\Lambda} \cdot R^t. \quad (11)$$

Therefore, Eq. (9) above can be built as a new objective model for the fiber-matrix interaction for retarding principal rate (RPR):

$$\dot{A}_{FM}^{RPR} = -R \cdot \dot{\Lambda}^{IOK} \cdot R^t. \quad (12)$$

where $\dot{\Lambda}^{IOK}$ is a rate of diagonal tensor with its components $\dot{\lambda}_i^{IOK}$ in the IOK assumption. Eq. (12) can be called the RPR Model.

4. Embodiment Model

Matrix $\dot{\Lambda}^{IOK}$ is a rate of a diagonal matrix in an IOK assumption. Thus, matrix $\Lambda^{IOK}$ can be referred to as the IOK diagonal matrix. Therein lies an additional dilemma for use of the RPR mode: what is tensor $\dot{\Lambda}^{IOK}$? It is known that $\dot{\Lambda}^{IOK}$ is absolutely related to the rate of eigenvalues, $\dot{\lambda}_i$, of the orientation tensor A, $$\dot{\Lambda}^{IOK} = \dot{\Lambda}^{IOK}(\dot{\lambda}_i). \quad (13)$$

The orientation tensor A's three invariants $I_1$, $I_2$, and $I_3$ are given as follows:

$$I_1 = \lambda_1 + \lambda_2 + \lambda_3; \quad (14)$$

$$I_2 = \lambda_1\lambda_2 + \lambda_2\lambda_3 + \lambda_3\lambda_1; \quad (15)$$

$$I_3 = \lambda_1\lambda_2\lambda_3. \quad (16)$$

Thus, one can widely infer that the tensor $\dot{\Lambda}^{IOK}$ is a function of $\dot{I}_1$, $\dot{I}_2$, and $\dot{I}_3$:

$$\dot{\Lambda}^{IOK} = \dot{\Lambda}^{IOK}(\dot{I}_1, \dot{I}_2, \dot{I}_3) \quad (17)$$

where $\dot{I}_1$, $\dot{I}_2$, and $\dot{I}_3$ are a rate of $I_1$, $I_2$, and $I_3$ with respect to time, respectively.

To obtain a simple relationship of $\dot{\Lambda}^{IOK}$, the orientation tensor A's first invariant value, $I_1$ is a summation of eigenvalues and equals one, i.e., $$I_1 = \sum_{i=1}^{3} \lambda_i = 1. \qquad (18)$$

Its derivative is zero:

$$\sum_{i=1}^{3} \dot{\lambda}_i = 0. \qquad (19)$$

More importantly, the matrix $\dot{\Lambda}$ or the rate of eigenvalues $\dot{\lambda}_1$ should be provided via the inverse of Eq. (11):

$$\dot{\Lambda} = \begin{bmatrix} \dot{\lambda}_1 & 0 & 0 \\ 0 & \dot{\lambda}_2 & 0 \\ 0 & 0 & \dot{\lambda}_3 \end{bmatrix} = R^t \cdot \dot{A} \cdot R, \qquad (20)$$

wherein the tensor $\dot{A}$ involves two terms: (i) the Jeffery hydrodynamics ($\dot{A}_{HD}{}^J = (W \cdot A - A \cdot W) + \xi(D \cdot A + A \cdot D - 2A_4 : D)$); (ii) the Folgar-Tucker rotary diffusion ($\dot{A}_{DF}{}^{FT} = 2\dot{\gamma}C_I(I - 3A)$); both details are available elsewhere (see, J. Wang, J. F. O'Gara, and C. L. Tucker III, An Objective Model for Slow Orientation Kinetics in Concentrated Fiber Suspensions: Theory and Rheological Evidence, J. Rheol. 52, 1179 (2008)).

Notably, $$\sum_{i=1}^{3} \dot{\lambda}_i^{IOK}$$

is a certain summation in IOK, as a function of $$\sum_{i=1}^{3} \dot{\lambda}_i.$$

Further, assume that $$\sum_{i=1}^{3} \dot{\lambda}_i^{IOK} = 0. \qquad (21)$$

Accordingly, one can suggest two usual relationships as shown below. The first defensible equality of the $$\sum_{i=1}^{3} \dot{\lambda}_i^{IOK}$$

is dependent on $$\sum_{i=1}^{3} \dot{\lambda}_i = 0$$

with two parameters, $\alpha$ and $\beta$:

$$\sum_{i=1}^{3} \dot{\lambda}_i^{IOK} = \alpha \left( \sum_{i=1}^{3} \dot{\lambda}_i \right) - \beta \left( \sum_{i=1}^{3} \dot{\lambda}_i \right)^2. \qquad (22)$$

This equality can be decomposed to obtain rates of three components of the diagonal tensor, $\dot{\Lambda}^{IOK}$:

$$\dot{\Lambda}_{ii}{}^{IOK} = \dot{\lambda}_i{}^{IOK} = \alpha[\dot{\lambda}_i - \beta(\dot{\lambda}_i{}^2 + 2\dot{\lambda}_j \dot{\lambda}_k)], i,j,k = 1,2,3, \qquad (23)$$

where the subscripts i, j, and k are indexes of permutation and $0 \leq \alpha \leq 1$ is a fiber-matrix interaction parameter. A fine-tuning factor, $\beta \geq 0$, is related to the type of flow field: $\beta = 0$ for a simple flow and $\beta > 0$ for a complex flow. Note that three eigenvalues have a limitation of $\lambda_1 \geq \lambda_2 \geq \lambda_3$.

Furthermore, one can attribute the random-to-orientation process of fiber-polymer suspension with the existence of barrier energy, $E_a'$. In contrast, parameter $\alpha$ is the parameter of the orientation-to-random process. According to kinetic understanding of the Arrhenius Activation Equation in isothermal temperature T, $\alpha$ is inversely proportional to $E_a'$. Therefore, one can obtain the equation:

$$\alpha = 1 - \exp\left(-\frac{E_a'}{RT}\right), \qquad (24)$$

where the energy $E_a'$ physically means the rotary movement of fibers immersed in polymeric fluids, as related to the fiber's length, flexibility, and concentration and the fluid's molecular structure and viscosity, as well as the geometry, speed, and boundary of flow filed.

On the other hand, one can obtain the second form of matrix $\dot{\Lambda}^{IOK}$, as follows:

$$\dot{\Lambda}^{IOK} = \begin{bmatrix} \omega_1 \dot{\lambda}_1 & 0 & 0 \\ 0 & \omega_2 \dot{\lambda}_2 & 0 \\ 0 & 0 & \omega_3 \dot{\lambda}_3 \end{bmatrix}, \qquad (25)$$

where $\omega_1$, $\omega_2$, and $\omega_3$ are scalar factors to individually scale the principal rate of $\dot{\lambda}_1$, $\dot{\lambda}_2$, and $\dot{\lambda}_3$.

Due to Eq. (21), there is a limitation of Eq. (25):

$$\omega_2 \dot{\lambda}_2 = -(\omega_1 \dot{\lambda}_1 + \omega_3 \dot{\lambda}_3). \qquad (26)$$

Therefore, the feasibility of Eq. (23) and Eq. (25) of tensor $\dot{\Lambda}^{IOK}$ has to be examined in this study, as compared with a benchmark test problem.

In summary, an assumption for the non-dilute suspension of rigid fibers immersed in polymer matrix, the complete equation of continuity of the probability density distribution function, is that the additional third term of the fiber-matrix interaction is considered separately from the first term of the hydrodynamic contributor and the second term of the diffusive contributor, as follows:

$$\frac{d\psi}{dt} = -\nabla_s \cdot [\dot{p}\psi - \dot{\gamma}C_I \nabla_s \psi] - k\psi, \qquad (27)$$

where the probability density distribution function $\psi(p)$ is a function of orientation vector p of a fiber; $\dot{p}$ is velocity vector of a fiber;

$$\frac{d}{dt}$$

is the material derivative and $\nabla_s$ is the surface spherical gradient operator; $\dot{\gamma}$ is the scalar magnitude of the tensor D, $\dot{\gamma}=(2D:D)^{1/2}$; $C_I$ is the fiber-fiber interaction coefficient; k is a characteristic constant of the fiber-matrix interaction from an alignment state to random distribution.

In order to compare to the RPR Model and the RSC Model in short fiber suspensions, one can apply both models based on the Folgar-Tucker (FT)_Equation (see, J. Wang, J. F. O'Gara, and C. L. Tucker III, An Objective Model for Slow Orientation Kinetics in Concentrated Fiber Suspensions: Theory and Rheological Evidence, J. Rheol. 52, 1179 (2008)). Tenor $\dot{A}^{J-FT-RPR}$ is the combination equation consisting of the Jeffery hydrodynamic $((W\cdot A-A\cdot W)+\xi(D\cdot A+A\cdot D-2A_4:D))$, Folgar-Tucker diffusion $(2\dot{\gamma}C_I(I-3A))$, and RPR terms $(-R\cdot\dot{\Lambda}^{IOK}\cdot R^t)$, and tensor $\dot{A}^{RSC}$ is the RSC Equation, as follows:

$$\dot{A}^{J-FT-RPR} = (W\cdot A - A\cdot W) + \xi(D\cdot A + A\cdot D - 2A_4:D) + 2\dot{\gamma}C_I(I-3A) - R\cdot\dot{\Lambda}^{IOK}\cdot R^t. \quad (4)$$

$$\dot{A}^{RSC} = (W\cdot A - A\cdot W) + \xi(D\cdot A + A\cdot D - 2A_4:D) + 2\dot{\gamma}C_I(I-3A) - 2(1-\kappa)\xi(L_4 - M_4:A_4):D - 2(1-\kappa)\dot{\gamma}C_I(I-3A). \quad (5)$$

where $\dot{A}$ represents the material derivative of second order orientation tensor A; $A_4$ is the fourth order orientation tensor; $L=\nabla v=W+D$ is the velocity gradient tensor with its component of $L_{ij}=\nabla_j v_i$, $v_i$ is the component of the velocity in the $x_j$ direction; $W=\frac{1}{2}(L-L^T)$ is the vorticity tensor; $D=\frac{1}{2}(L+L^T)$ is the rate-of-deformation tensor. $\xi$ is a shape factor of a particle. $\dot{\gamma}$ is the scalar magnitude of the tensor D, $\dot{\gamma}=(2D:D)^{1/2}$; $C_I$ is the fiber-fiber interaction coefficient; R represents a rotation matrix; $R^t$ represents a transpose of the rotation matrix R; $\Lambda$ represents a diagonal tensor of a orientation tensor of fibers A; $\dot{\Lambda}^{IOK}$ represents a rate of the diagonal tensor with respect to time; $\kappa$ is a scalar factor; the fourth order tensors $L_4$ and $M_4$ are calculated from the eigenvalues and the eigenvectors of second order orientation tensor A.

As already described, the differentiation between the tensors $\dot{A}^{J-FT-RPR}$ and $\dot{A}^{RSC}$ is very obvious. The RPR Model treats retarding the principal rate of the orientation tensor due to the fiber-matrix interaction in microscopic view. The RSC Model directly reduces a rate of change of fiber orientation of the hydrodynamic and the diffusion terms, due to the deformation of the fibers and the fluid in microscopic view.

Figure 8A:
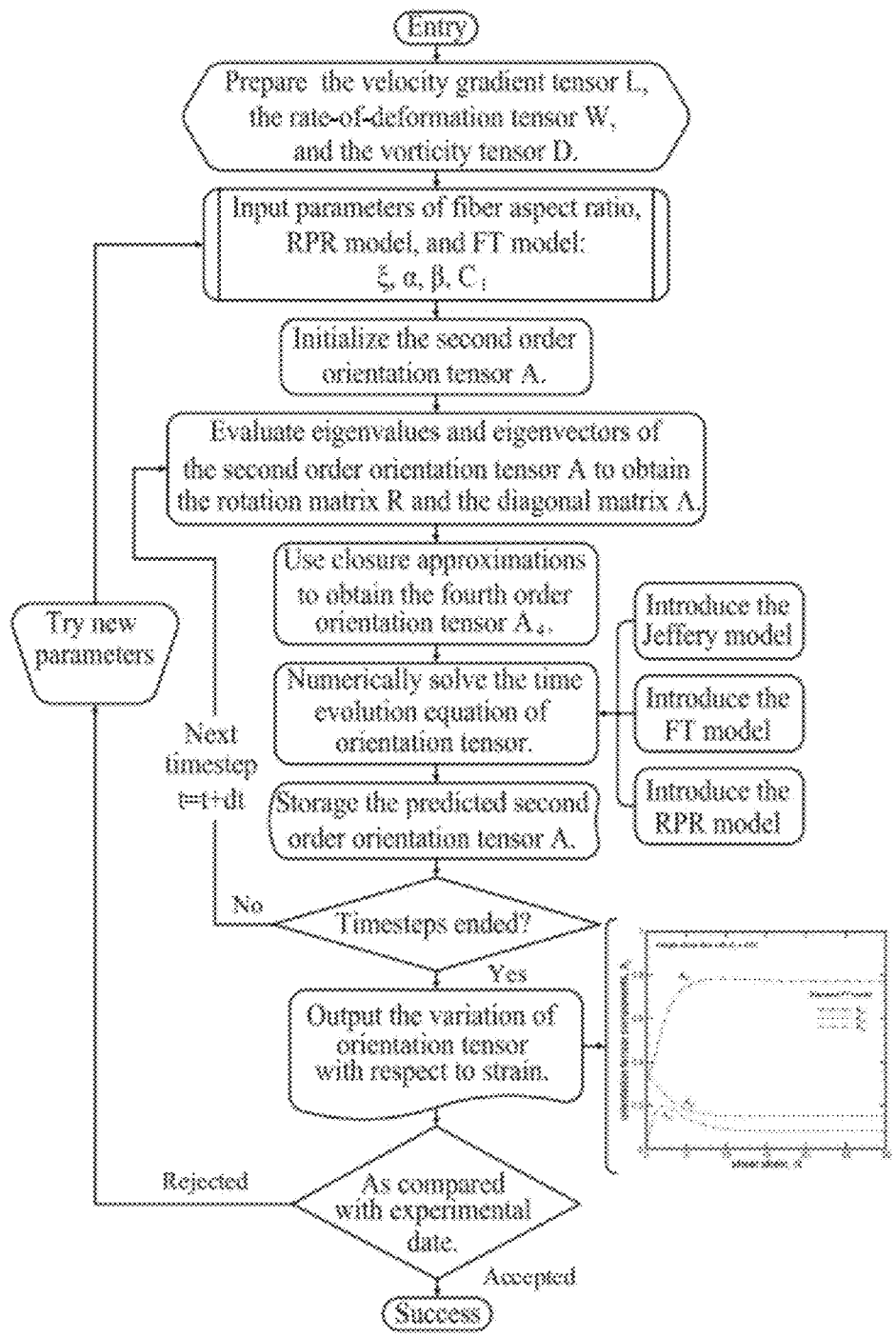
FIG. 8A is a flowchart of an algorithm for determining orientation of fibers in the fluid according to one embodiment of the present invention of the RPR Model.

The implementation of the RPR Model is illustrated in the flow chart in FIG. 8A. This computational method comprises the steps of:
(i) After the entry, the first operational step prepares the velocity gradient tensor, L; the rate-of-deformation tensor, W; and the vorticity tensor, D.
(ii) The second operation inputs parameters for the fiber aspect ratio, the RPR Model: $\xi$, $\alpha$, $\beta$, $C_I$.
(iii) The third operation initializes the second order orientation tensor, A. If there is no experimental data, tensor A can be set at an isotropic random orientation state, $A=\frac{1}{3}I$, where I is the identity matrix.
(iv) Start or get into a sequence of time steps. Evaluate the eigenvalues $\lambda_i$ and eigenvectors $e_i$ of the second order orientation tensor, A, to obtain the rotation matrix, R, and the diagonal matrix, $\Lambda$; notably, $R=[e_1,e_2,e_3]$ and its transpose matrix is $R^t$.
(v) Use the "ORE closure" to obtain an approximation of the fourth order orientation tensor, $A_4$. The ORE closure is well known in the art (see, B. E. VerWeyst, Ph.D. Thesis, University of Illinois at Urbana-Champaign, 1998).
(vi) Using the fourth order Runge-Kutta Numerical Method, solve the time evolution equation of the orientation tensor, including three terms of the Jeffery Model for fiber hydrodynamic $(\dot{A}_{HD}^J=(W\cdot A-A\cdot W)+\xi(D\cdot A+A\cdot D-2A_4:D))$, the Folgar-Tucker (FT) diffusion $(2\dot{\gamma}C_I(I-3A))$, and the RPR Model of the fiber-matrix interaction $(-R\cdot\dot{\Lambda}^{IOK}\cdot R^t)$ with the IOK diagonal tensor $(\dot{\Lambda}_{ii}^{IOK}=\dot{\lambda}_i^{IOK}=\alpha[\lambda_i-\beta(\lambda_i^2+2\lambda_j\lambda_k)])$.
(vii) Store the predicted second order orientation tensor, A.
(viii) Determine whether the maximum allowable number of steps has been performed. A "yes state" allows you to continue to the next step, otherwise the "no state" requires that you return to "the preceding step (iv)" and again execute this portion of the operation.
(ix) Output the variation of orientation tensor with respect to strain.
(x) Determine whether the prediction of the curve for the orientation tensor component, with respect to strain/time, is acceptance or rejection, as compared with experimental data.
(xi) If rejected, the current step returns to "the preceding step (ii)". Insert new values for the parameters of the fiber aspect ratio, and again execute a portion of the operations using the RPR Model.
(xii) If accepted, the program can be exited with success.

Having coded the steps above, one can perform the program to obtain an executable package. This is useful to predict the time history of an orientation tensor when determining the parameters of the RPR Model and the initial conditions of the velocity gradient tensor. Higher prediction accuracy is dependent on the acceptable parameters fit by experimental data.

Overall, the RPR Model needs not be reconstructed, as it is a linear superposition term of Jeffery's hydrodynamic, anisotropic diffusion, and fiber-matrix interaction. One attractive point is that the RPR Model combined with the standard FT equation has just three parameters ($C_I$, $\alpha$, and $\beta$).

5. Long Fiber Orientation Model

So far, those technologies mentioned above are concerned only with short fiber suspension rheology. Long fibers are generally longer than 1 mm. In equilibrium states, the short fiber orientation is assumed to be random isotropic, but the long fiber orientation is anisotropic. In injection-molded parts, the fiber alignment in the flow direction is smaller in long-fiber materials than in short-fiber materials.

As for long fiber suspensions, Phelps and Tucker recently suggested a two-dimensional diffusion tensor in the surface spherical coordinate to obtain an anisotropic rotary diffusion (ARD) orientation equation (see, J. H. Phelps and C. L. Tucker III, "An anisotropic rotary diffusion model for fiber orientation in short- and long-fiber thermoplastics", J. Non-Newtonian Fluid Mech. 156 165 (2009)). In addition, the ARD tensor was approached by using Hand's Tensor (see, G. L. Hand, "A theory of anisotropic fluids", J. Fluid Mech. 13, 33 (1962)), which depends on the orientation tensor and the rate-of-deformation tensor. Simultaneously, they can combine the RSC Model and the ARD Model to further obtain so-called ARD-RSC Model.

Unfortunately, the ARD-RSC Model is widely applied with difficulty because the parameters are so sensitive as to not be easily determined. These inappropriate values of the parameters may cause poor divergence results. No logistics criterion or experiential rule to adjust six ARD-RSC parameters is proposed. Nevertheless, Phelps and Tucker offered a program to fit experimental data and obtained a lot of possible sets of those parameters (see, J. H. Phelps and C. L. Tucker III, "An anisotropic rotary diffusion model for fiber orientation in short- and long-fiber thermoplastics", J. Non-Newtonian Fluid Mech. 156 165 (2009)). This program is somewhat complicated and inconvenient to use.

The fiber motions in the fluid include a transitional movement and a rotatory movement. In the second method of the present invention, the length of the long fiber generates the steric barrier limited in flow field and then decreases the rotary diffusive movement itself. Especially such a steric barrier in the gradient direction of the flow field may be "maximal" in contrast to flow and neutral directions. For this reason, a so-called "dimensionless flow-resistance tensor $\tilde{L}$" is introduced, depending on the known velocity gradient tensor L:

$$\tilde{L} = \frac{L^T \cdot L}{L^T : L}, \quad (30)$$

where the tensor $\tilde{L}$ is a second order symmetric tensor with its trace $\tilde{L}=1$, and has the same properties of matrix as orientation tensor, A. Tensor, $\tilde{L}$ physically implies that the obstacle to the movement of long fibers occurs in a gradient direction of the flow fields with respect to the velocity gradient tensor.

The steric barrier effect is induced by the fiber's length, flexibility, concentration and fluid's molecular structure, temperature, and viscosity, as well as the geometry, speed, and boundary of flow filed. Therefore, one can assume the anisotropic rotary diffusion tensor $D_r$ to be a function of such a tensor $\tilde{L}$, $$D_r = D_r(\tilde{L}). \quad (31)$$

As a review of to fiber suspensions without an external force, the rotary diffusion tensor $D_r$ of isotropic fibers can be usually given, as follows:

$$D_r = D_0 I. \quad (32)$$

where $D_0$ is a rotary diffusion parameter indicative of fiber-fiber interactions that models the effect of the fiber-fiber interactions on their angular velocity; I is the identity matrix. Note that the identity matrix physically means the ideal rotary diffusive movement of isotropic fibers.

As in the fiber suspension fluids of the preceding Folgar-Tucker Model, the coefficient contains the effect of flow field and the suspension parameters. Therefore, $D_0$ was expressed as $$D_0 = \dot{\gamma} C_I, \quad (33)$$

where $C_I$ is a dimensionless number that models the effect of the suspension on the fiber-fiber interaction; $\dot{\gamma}$ is the strain rate of the flow field. From the definition of $D_0$ above, it is seen that once the flow ceases and then $\dot{\gamma}$ goes to zero so that the fiber-fiber interaction also disappear.

Drawing from the conventional isotropic rotary diffusion tensor integrated with a dimensionless flow resistance tensor, therefore, we consider that the diffusion of the fibers into the fluid and propose a new anisotropic rotary diffusion tensor with two parameters, $D_0$ and $C_M$, as follows:

$$D_r = D_0(I - C_M \tilde{L}), \quad (34)$$

where the rotary diffusion parameter $D_0$ was mentioned above; a new parameter $C_M$ is a dimensionless number that models a the iARD parameter indicative of a steric barrier of mobile fiber embedded in the polymer matrix. Both parameters are related to the fiber's length, flexibility, and concentration and the fluid's molecular structure, temperature, and viscosity. The tensor $\tilde{L}$ is related to the geometry, speed, and boundary of flow filed. The minus indicated in the equation above means a decrease in diffusive movement of the fibers.

As already described, this equation differs greatly with the conventional Hand's anisotropic diffusion tensor with five parameters used by Phelps and Tucker (see, J. H. Phelps and C. L. T. III, "An anisotropic rotary diffusion model for fiber orientation in short- and long-fiber thermoplastics", J. Non-Newtonian Fluid Mech. 156 165 (2009)). Using the steric barrier concept, we model the new anisotropic diffusion tensor for long fiber suspension in the flow field, and propose a new diffusion tensor. Consequently, one can obtain an improved ARD Model (iARD) $\dot{A}_{DF}^{iARD}$, involving the FT Model indicative of isotropic rotary diffusion $\dot{A}_{DF}^{FT}$ and the Steric Barrier (SB) Model indicative of anisotropic diffusion $\dot{A}_{DF}^{SB}$:

$$\dot{A}_{DF}^{iARD} = \dot{A}_{DF}^{FT} + \dot{A}_{DF}^{SB}, \quad (6)$$

$$\dot{A}_{DF}^{SB} = 2\dot{\gamma} C_I C_M \{(A-\tilde{L}) + 5[(A \cdot \tilde{L})_{symm} - (A_4 \cdot \tilde{L})]\}, \quad (7)$$

$$(A \cdot \tilde{L})_{symm} = \frac{1}{2}[A \cdot \tilde{L} + (A \cdot \tilde{L})^t], \quad (8)$$

where $(A \cdot \tilde{L})_{symm}$ is the symmetric matrix of $A \cdot \tilde{L}$; $(A \cdot \tilde{L})^t$ is the transpose matrix of $A \cdot \tilde{L}$. Notably, the SB Term is related to the fiber-fiber interaction ($C_I$), the fiber steric mobile barrier ($C_M$), and the flow field ($\tilde{L}$). The iARD Model can strongly affect the transient change and the steady convergence in orientation, but has a weak ability to control the transient rate of orientation. Thus, the iARD Equation above is significantly indicative of changes in fiber orientation due to the well-known Folgar-Tucker isotropic rotary diffusion and the length-induced steric mobile barrier of the fiber rotary movement.

As already described, the differentiation between the ARD and iARD models is obvious in use of anisotropic rotary diffusion tensor of fibers. The second method of the present invention is to develop a new anisotropic rotary diffusion tensor with fewer parameters than Hand's Tensor (see, G. L. Hand, "A theory of anisotropic fluids", J. Fluid Mech. 13, 33 (1962)) used by Phelps and Tucker (see, J. H. Phelps and C. L. Tucker III, "An anisotropic rotary diffusion model for fiber orientation in short- and long-fiber thermoplastics", J. Non-Newtonian Fluid Mech. 156 165 (2009)). As a comparison, the iARD model consists of the identity tensor and an additional dimensionless flow-resistance tensor with two parameters, but the ARD model depends on the orientation tensor and the rate-of-deformation tensor. It is an important merit to directly understand that the iARD Model is related to the isotropic Folgar-Tucker diffusion term, as well as an additional contributor due to a fiber-length-induced steric barrier. Also, the iARD Model can be integrated with the first method of the present invention of the RPR Model, i.e., so-called iARD-RPR Model.

Figure 8B:
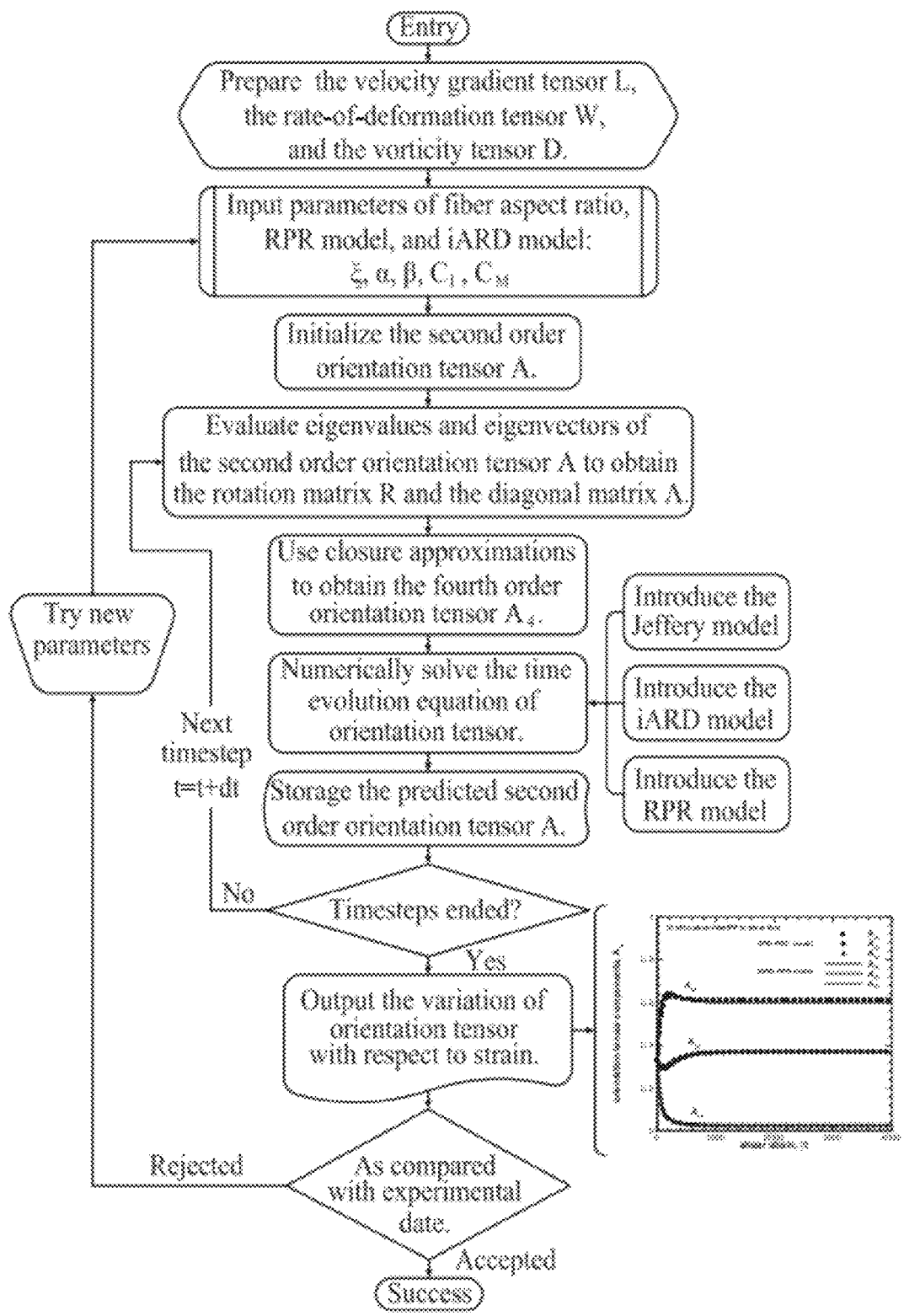
FIG. 8B is a flowchart of an algorithm for determining orientation of fibers in the fluid according to one embodiment of the present of the iARD-RPR Model.

The implementation of the iARD Model combined with the RPR Model is illustrated in the flow chart in FIG. 8B. This computational algorithm is comprised of the following twelve steps:

(i) After the entry, the first operational step prepares the velocity gradient tensor, L; the rate-of-deformation tensor, W; and the vorticity tensor, D.

(ii) The second operation inputs parameters for the fiber aspect ratio, the RPR Model, and the iARD Model: $\xi$, $\alpha$, $\beta$, $C_I$, and $C_M$.

(iii) The third operation initializes the second order orientation tensor, A. If there is no experimental data, tensor A can be set at an isotropic random orientation state, A=⅓I, where I is the identity matrix.

(iv) Start or get into a sequence of time steps. Evaluate the eigenvalues and eigenvectors of the second order orientation tensor, A, to obtain the rotation matrix, R, and the diagonal matrix, Λ; notably, R=[$e_1,e_2,e_3$] and its transpose matrix is $R^t$.

(v) Use the "ORE closure" to obtain an approximation of the fourth order orientation tensor, $A_4$.

(vi) Using the fourth order Runge-Kutta Numerical Method, solve the time evolution equation of the orientation tensor, including three terms of the Jeffery Model for fiber hydrodynamic, $\dot{A}_{HD}^J$, the iARD Model of fiber diffusion, $\dot{A}_{DF}^{iARD}$, and the RPR Model of the fiber-matrix interaction, $\dot{A}_{FM}^{RPR}$, with the IOK diagonal tensor, $\dot{\Lambda}^{IOK}$.

(vii) Store the predicted second order orientation tensor, A.

(viii) Decide whether the maximum allowable number of steps has been performed; if the time step has ended? A "yes state" allows you to continue to the next step, otherwise the "no state" requires that you return to "the preceding step (iv)" and again execute this portion of the operation.

(ix) Output the variation of orientation tensor with respect to strain.

(x) Decide whether the prediction of the curve for the orientation tensor component, with respect to strain/time, is acceptance or rejection, as compared with experimental data.

(xi) If rejected, the current step returns to "the preceding step (ii)". Try new values for the parameters of the fiber aspect ratio, the RPR Model, and the iARD Model to again execute a portion of the operations.

(xii) If accepted, the program can be exited with success.

Having coded the steps above, one can perform the program to obtain an executable package. This is useful to predict the time history of an orientation tensor with respect to time when determining the parameters of the iARD-RPR Model and the initial conditions of the velocity gradient tensor. Higher prediction accuracy is dependent on acceptable parameters, fit by experimental data.

Figure 8C:
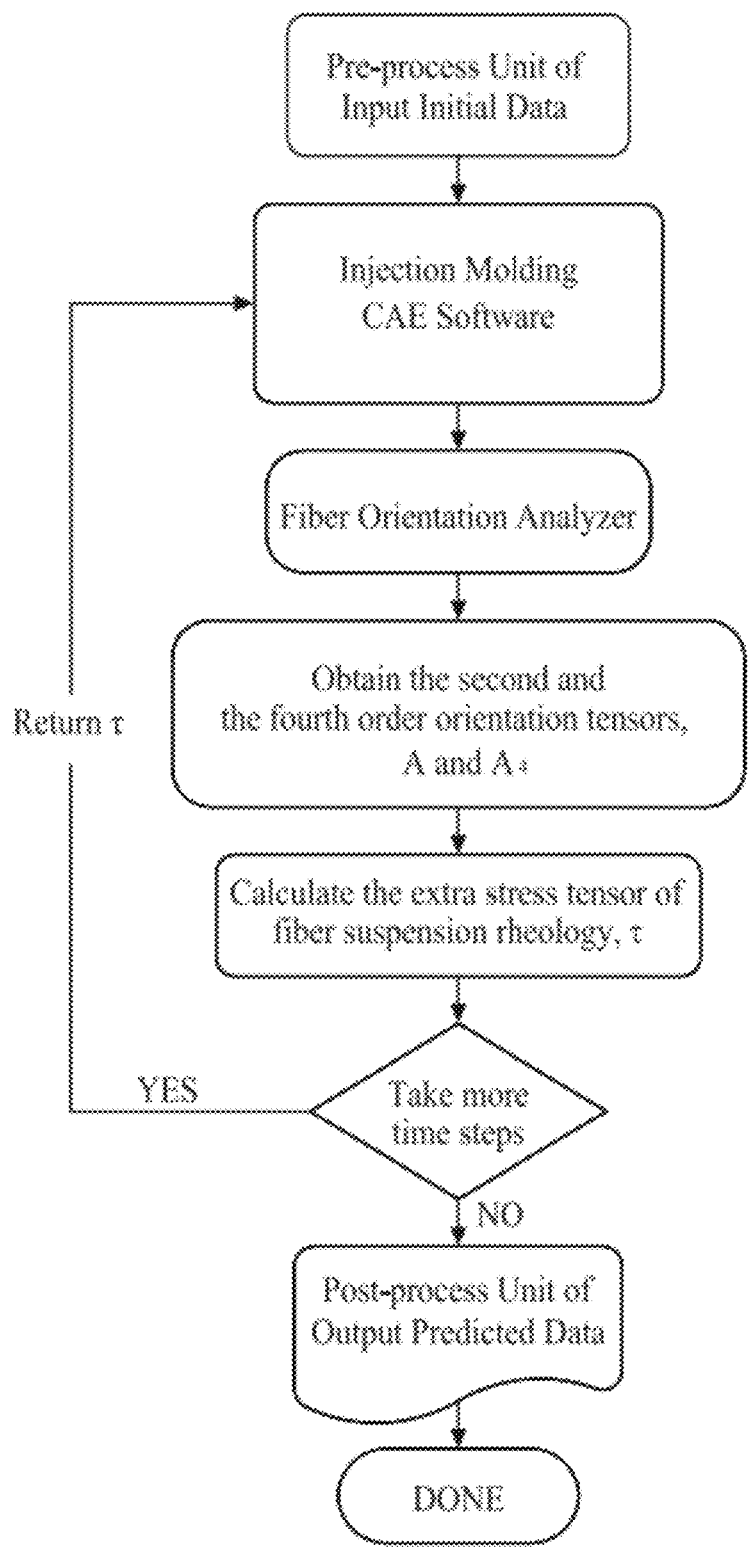
FIG. 8C is a flowchart showing a role of the fiber orientation analyzer between the CAE software and the extra stress in suspension rheology.

The anisotropic constitutive equation for Fiber Suspension Models has been developed for a long time, wherein the central problem is determining the orientation tensor. A reliable fiber-orientation analyzer for numerical simulations is one area of computer-aided engineering (CAE) to consider. The orientation analyzer can be embedded in today's commercially available CAE software. As shown in FIG. 8C, the CAE software for injection molding can offer a velocity gradient tensor in the filling flow field to the fiber-orientation analyzer. Thus, the orientation analyzer is able to determine an acceptable orientation tensor. It is important that the constitutive equation for fibers obtains the orientation tensor to calculate the fiber suspension stress tensor. In the next step, this stress tensor is returned to the CAE software for update. Therefore, in future work the embodiment of the fiber orientation program will play an important role. This is helpful to today's CAE development of injection molding for fiber reinforced composites.

Figure 9:
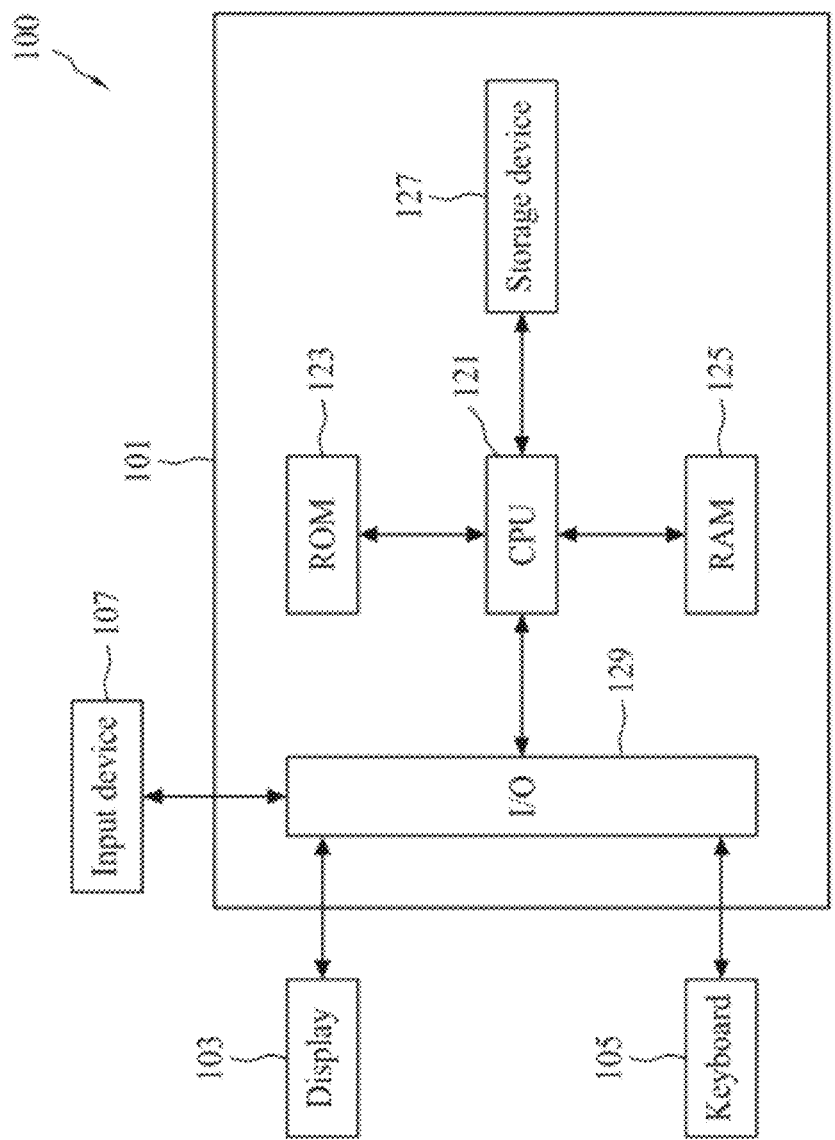
FIG. 9 illustrates a computing system for determining orientation of fibers in the fluid according to one embodiment of the present invention.

FIG. 9 illustrates a computing system 100 for determining orientation of fibers in the fluid according to one embodiment of the present invention. In one embodiment of the present invention, the computing system 100 includes a computer 101, a display device 103, a keyboard 105, and an input device 107 such as a card reader or an optical disk drive. The input device 107 is configured input software algorithms stored in a computer readable media, and the computer 101 is configured to execute software algorithms for determining orientation of fibers in the fluid. The computer 101 includes a central processing unit (CPU) 121, a read-only memory (ROM) 123, a random access memory (RAM) 125, a storage device 127, and an input/output (I/O) interface 129. The CPU 121 operably communicates with the ROM 123, the RAM 125, the storage device 127, and the I/O interface 129. The CPU 121 reads software algorithms from the input device 107 or the storage device 127, executes the calculation steps, and stores the calculated result in the RAM 125.

EXAMPLES

The scope of examples of the present invention is fourfold. Two necessary works is to validate the RPR model and the iARD-RPR model investigated in benchmarks of computation for various types of flow fields. Furthermore, the significant examines of the iARD-RPR model is to see if it can reasonably fit the experimental data of orientation. Last, the practical application of the iARD-RPR Model to injection filling for predicting fiber orientation is compared with measurement data of fiber orientation.

1. Validations of RPR Model

The flow field of interest includes the simple flow and combination flow for the isotropic short fiber suspension. The simple flows are two classic flows: simple shear flow and planar elongation flow. The combination flow is the shearing-stretch combination flow. Details of the validation are available elsewhere (see, J. Wang, J. F. O'Gara, and C. L. Tucker III, An Objective Model for Slow Orientation Kinetics in Concentrated Fiber Suspensions: Theory and Rheological Evidence, J. Rheol. 52, 1179 (2008)).

The fiber's shape factor and the fiber-fiber interaction parameter used are set as ξ=1 and $C_I$=0.01, respectively. The initial condition of the second orientation tensor is the isotropic state, A=I/3. Note that L is the velocity gradient tensor with components $L_{ij}=\partial v_i/\partial x_j$, wherein $v_i$ is the component of the velocity in the $x_j$ direction with the subscripts i, j=x, y, z To retard the transient orientation rate, the parameter of the RSC Model is κ=0.1, and the parameters of the PRP Model are α=0.9 and β=0.0.

I. Simple Flow

Figure 10:
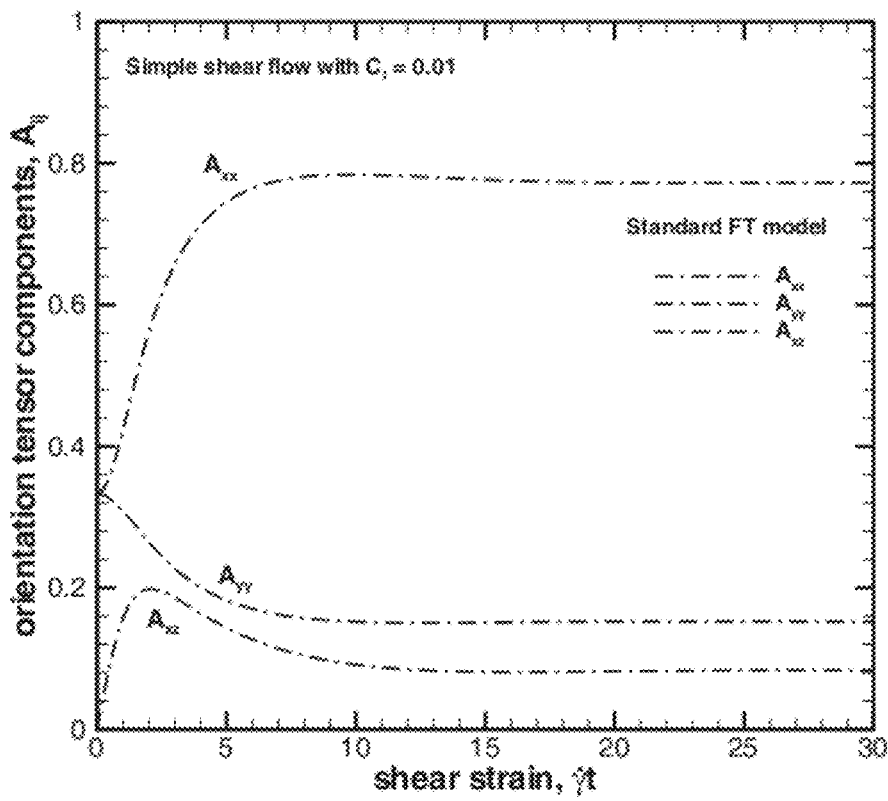
FIG. 10 and FIG. 11 are charts showing the comparison of the standard FT Model, the RSC Model, and the RPR Model for prediction of orientation tensor components with respect to shear strain under simple shear flow.

The simple shear flow and the planar elongation flow are fundamental in the rheological field. The first flow field is a simple shear flow with a flow direction of x axis, a gradient direction of z axis, and a neutral direction of y axis:

$$L = \begin{bmatrix} 0 & 0 & \dot{\gamma} \\ 0 & 0 & 0 \\ 0 & 0 & 0 \end{bmatrix}, \quad (38)$$

where $\dot{\gamma}$ is the shear rate. FIG. 10 shows three attentive tensor components, $A_{xx}$, $A_{yy}$, and $A_{xz}$ for the standard FT Model. As the strain increases, the $A_{xx}$ component increases and the $A_{zz}$ component, correspondingly, decreases. There is an overshoot behavior of the $A_{xz}$ component. Until steady state, all components also converge.

Figure 11:
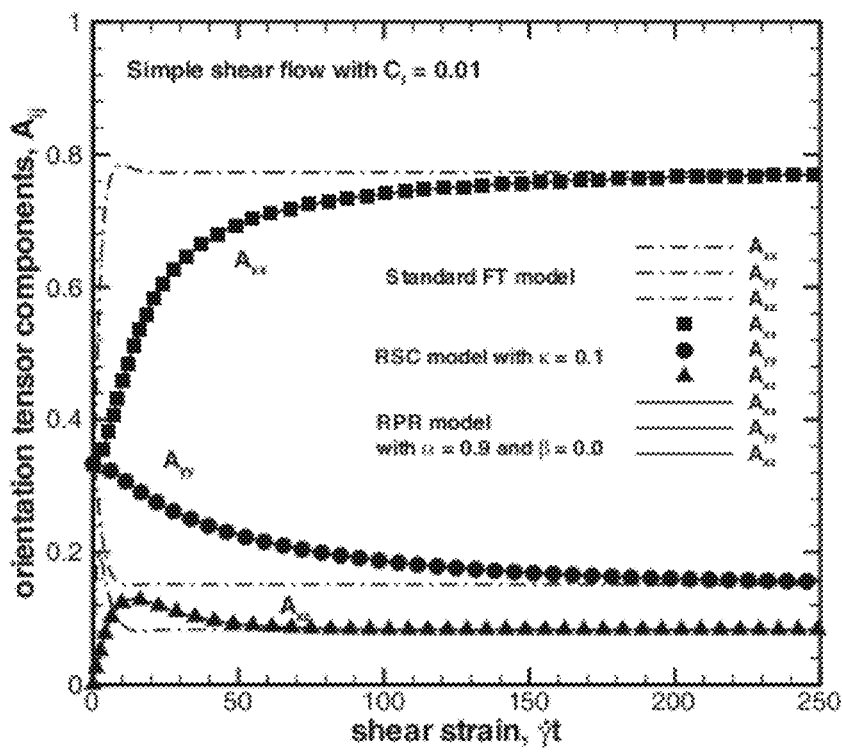

In FIG. 11, the standard FT Model, the RSC Model, and the RPR Model are graphed by a dash line, square symbols, and a solid line, respectively. One can clearly observe that the RSC symbols fall in the RPR solid line. When compared with the standard FT Model, the RSC Model and the RPR Model can surely slow down the transient rate of orientation, especially for flow direction component $A_{xx}$. After the transient point, all component curves begin to converge. At the same time, the curves for these models match each other. In short, the RSC Model and the RPR Model can retard the transient rate of the FT curve, but not change the convergent value.

The second flow test is a planar elongation flow, with the extensive direction of x axis and compressive direction of y axis:

$$L = \begin{bmatrix} \dot{\varepsilon} & 0 & 0 \\ 0 & -\dot{\varepsilon} & 0 \\ 0 & 0 & 0 \end{bmatrix}, \quad (39)$$

where $\dot{\varepsilon}$ is the elongation rate.

Figure 12:
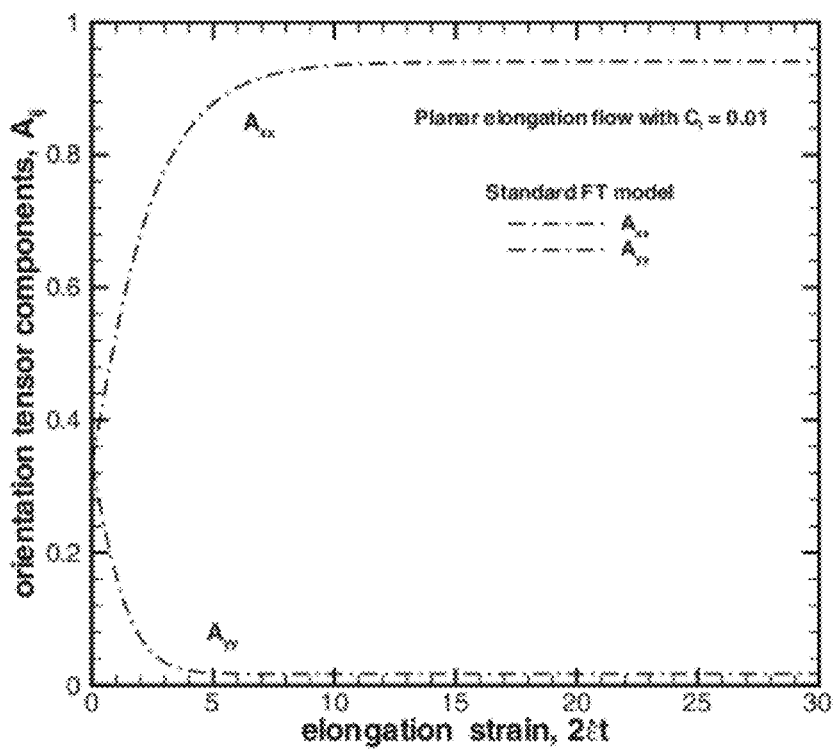
FIG. 12 and FIG. 13 are charts showing the comparison of the standard FT Model, the RSC Model, and the RPR Model for prediction of orientation tensor components with respect to elongation strain under planar elongation flow.
Figure 13:
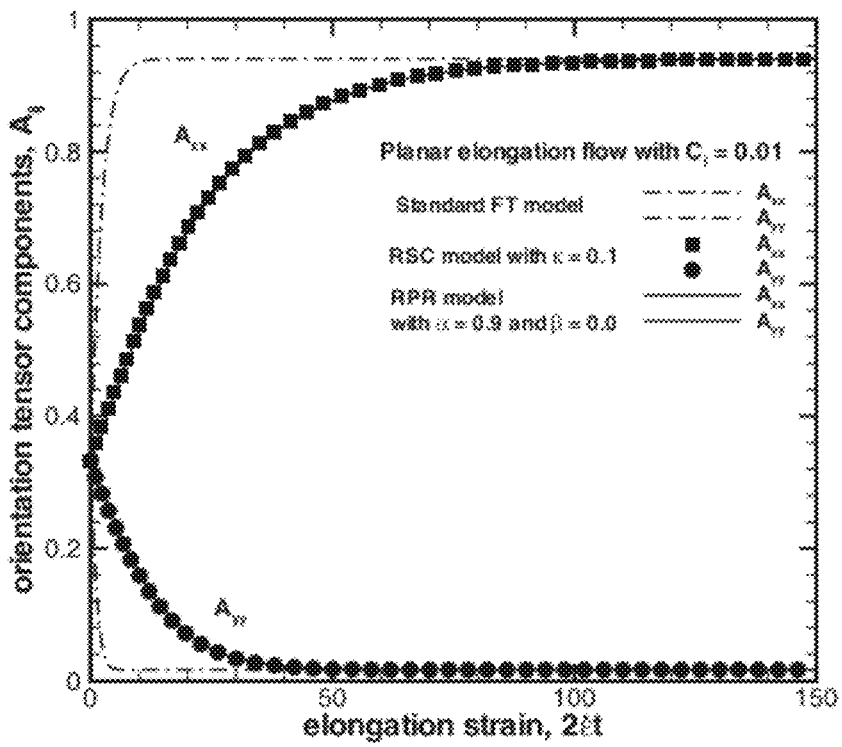

FIG. 12 shows only components $A_{xx}$ and $A_{yy}$, predicted by the standard FT Model, otherwise components are close to zero in value. In FIG. 13, both RSC Model and RPR Model reasonably predict the delay in the transient behavior of fiber orientation. All curves for both models also match each other. Regardless of shear or elongation flows, the curves for slow orientation kinetics, therefore, are similar to the standard FT curve without missing primary features.

II. Combination Flow

In the practical injection mold filling process, the center-gated disk flow is led by complex combination flows consisting of both shear and stretch deformations. Consider that the combination flow field of interest is the shearing in the xz-plane merging with stretching in the xy-plane. The tensor, L, is given as follows:

$$L = \begin{bmatrix} -\dot{\varepsilon} & 0 & \dot{\gamma} \\ 0 & \dot{\varepsilon} & 0 \\ 0 & 0 & 0 \end{bmatrix}, \quad (40)$$

wherein t the ratio of the shear rate to the stretch rate is $\dot{\varepsilon}/\dot{\gamma}=0.1$.

Figure 14:
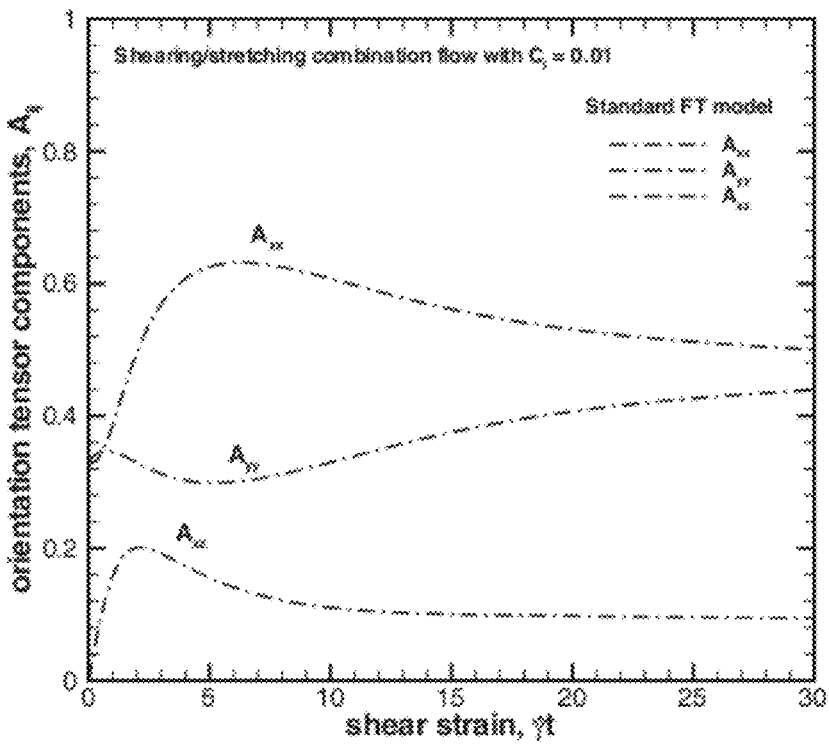
FIG. 14 and FIG. 15 are charts showing the comparison of the standard FT Model, the RSC Model, and the RPR Model for prediction of orientation tensor components with respect to shear strain under shearing/stretching combination flow.

FIG. 14 shows the attentive tensor components $A_{xx}$, $A_{yy}$, and $A_{xz}$ for the FT Model under a shearing-stretch combination flow. Differing from the shear flow shown in FIG. 12, it is significant in the transient state to obtain a strong overshoot of the components $A_{xx}$ and a strong trough of the component $A_{yy}$. In general, the existence of the overshoot and the trough are precisely found by directly solving the probability distribution function calculation.

Figure 15:
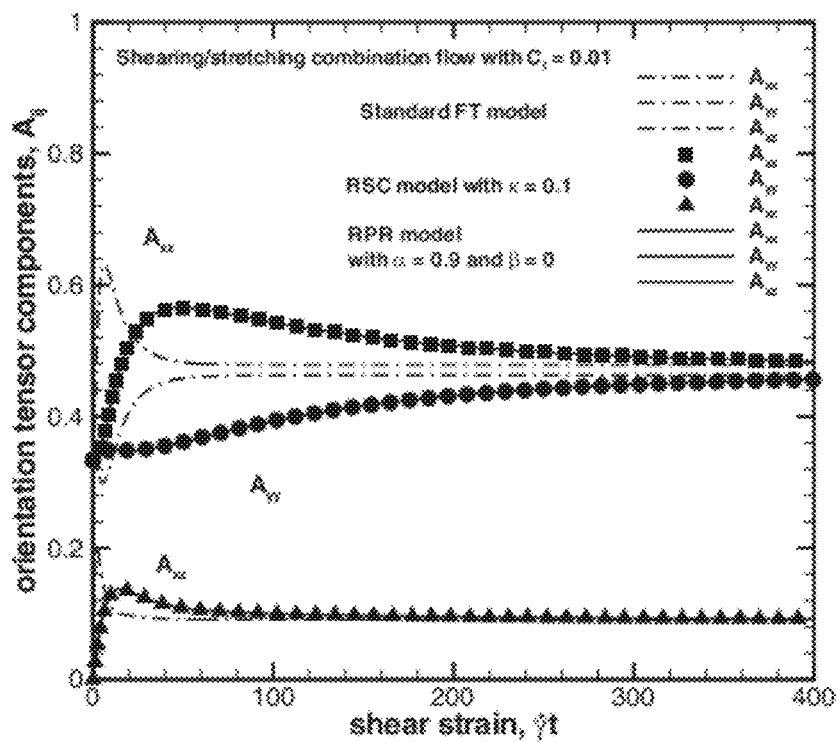
Figure 16A:
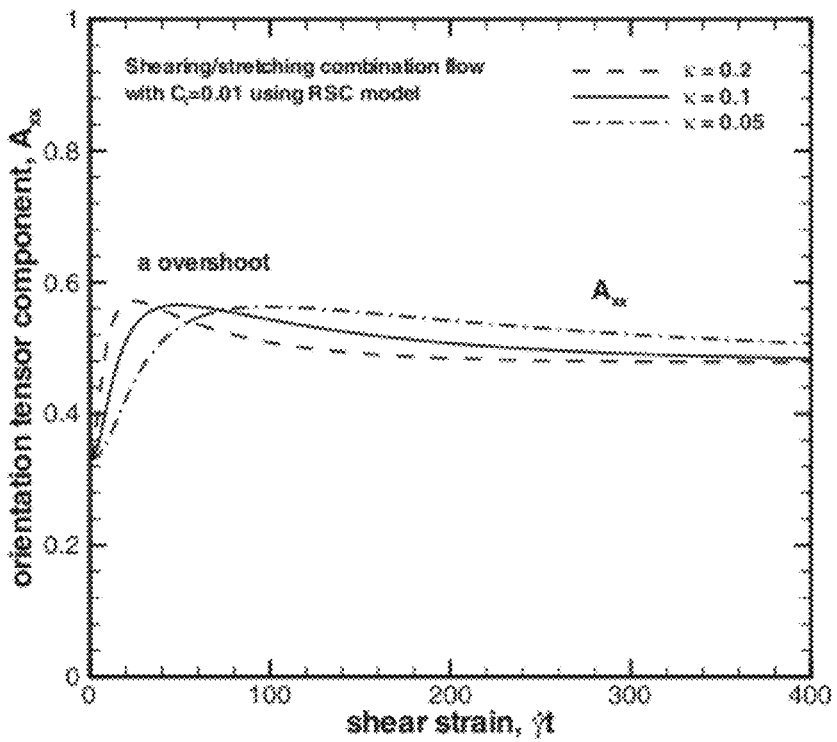
FIG. 16A to FIG. 16C show, at different values of the RSC parameter κ, tensor components with respect to shear strain under shearing/stretching combination flow: (a) $A_{xx}$, (b) $A_{yy}$, and (c) $A_{xz}$.
Figure 16B:
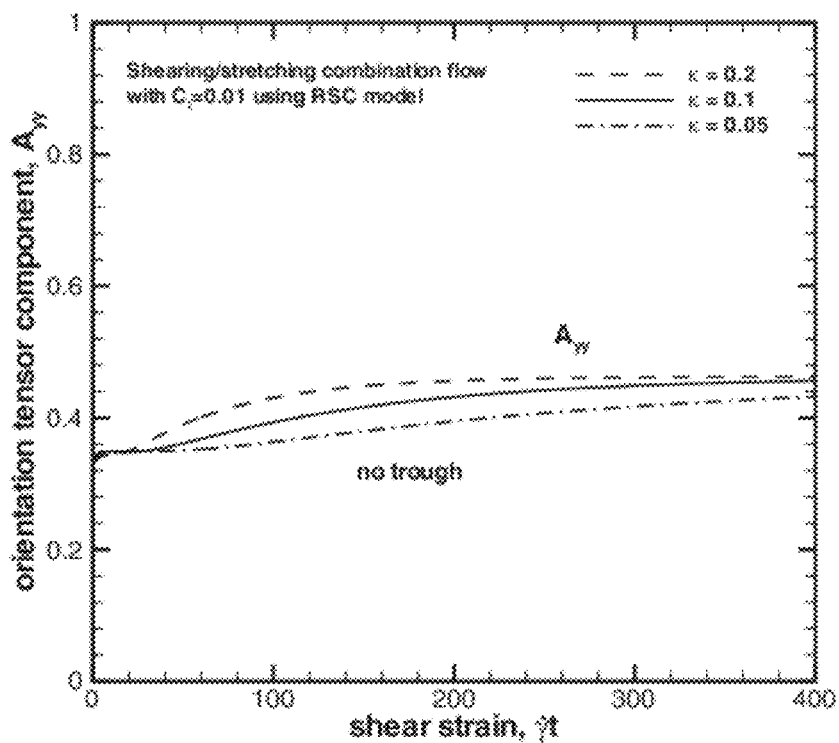
Figure 16C:
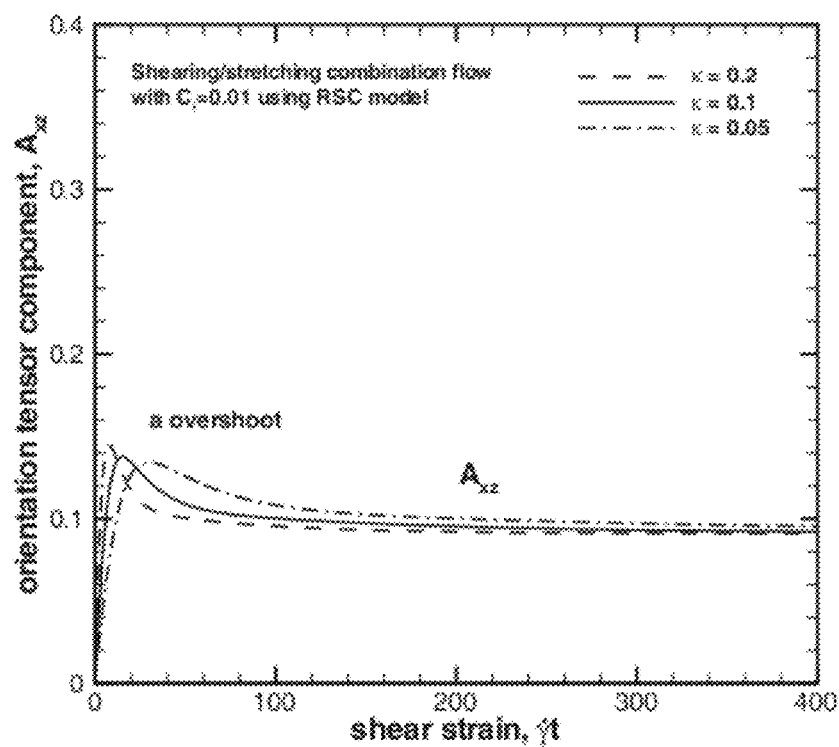

After using the RPR of the present invention and the conventional RSC Models, FIG. 15 expectedly exhibits the slow orientation kinetic for these components. However, there is a strange finding in components, $A_{xx}$ and $A_{yy}$: the overshoot is indistinctive with under-prediction, while the trough surprisingly vanishes. Still, it is not useful to adjust parameter κ (0.2, 0.1, and 0.05) of the RSC Model, as shown in FIG. 16A to FIG. 16C. As the parameter decreases, the transient rate of all components is increasingly reduced. The RSC Model may be incapable of yielding the trough of the component $A_{yy}$ and enhancing the strength of overshoot of the component $A_{xx}$.

Figure 17:
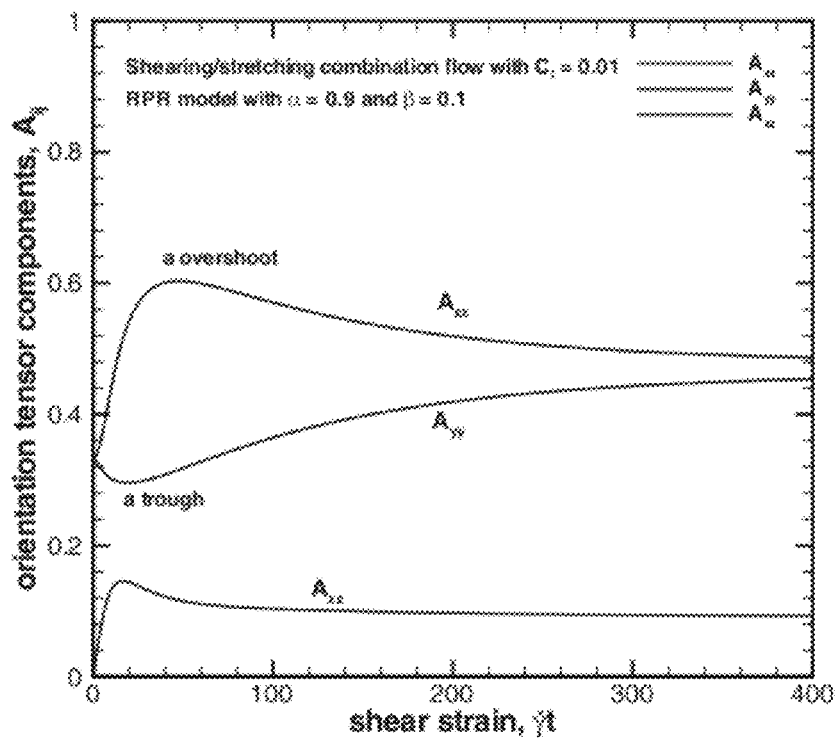
FIG. 17 shows the prediction of orientation tensor components with respect to shear strain under shearing/stretching combination flow by using the RPR Model with the first relationships: α=0.9 and β=0.1.

In order to overcome this issue, one can attempt to try the first method of the present invention of the RPR Model's a fine-tune factor, β. Thus, the set values are α=0.9 and β=0.1. As a result, FIG. 17 clearly presents both primary features, the overshoot and the trough. This demonstrates that factor β importantly controls the transient features of the orientation curve. Therefore, concerning the existence of this issue mentioned above, the RPR Model, with a nonzero value of factor β, is surely more reasonable in the complex flows than the RSC Model. In short, factor β is dependent on the kind of flow field: in simple flows, factor β can equal zero, but it is a non-zero in complex flow.

Figure 18:
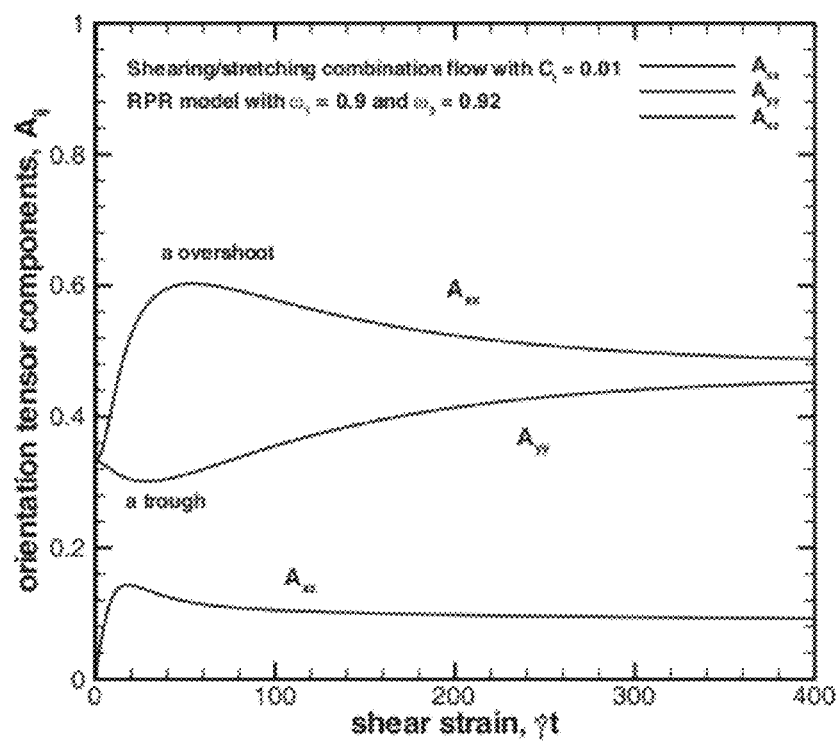
FIG. 18 shows the prediction of orientation tensor components with respect to shear strain under shearing/stretching combination flow by using the RPR Model with the second relationships: $\omega_1$=0.9 and $\omega_3$=0.92.

On the other hand, the second relationship of the $\dot{\Lambda}^{IOK}$ tensor shown in Eq. (25) has to be examined, as compared with the first relationship of $\dot{\Lambda}^{IOK}$. The scalar factors are $\omega_1=0.9$ and $\omega_3=0.92$. As a result, FIG. 18 clearly shows the overshoot and the trough. This figure also is almost in agreement with FIG. 17.

2. Validations of iARD-RPR Model

Three kinds of anisotropic long fiber suspensions under simple shear are addressed as follows:
  (i) 40 wt % glass-fiber immersed in polypropylene matrix;
  (ii) 31 wt % carbon-fiber immersed in polypropylene matrix; and
  (iii) 40 wt % glass-fiber immersed in nylon matrix.

Here, the aim is to exercise the iARD-RPR Model, as compared to the predicted curves of the conventional ARD-RSC Model (see, J. H. Phelps, Ph.D. Thesis, University of Illinois at Urbana-Champaign, 2009). Below, Table I lists four parameters of the iARD-RPR Model, including $C_I$, $C_M$, α, and β. Note that β=0 is due to the simple shear flow. As those conditions of the isotropic short fiber suspension, the fiber's shape factor is ξ=1 and the initial isotropic orientation tensor is A=I/3.

TABLE I

Parameters of the iARD-RPR Model fitting for orientation tensor components predicted by the ARD-RSC Model in different long fiber suspensions.

|  | 40 wt % glass-fiber/ PP | 31 wt % carbon-fiber/ PP | 40 wt % glass-fiber/ Nylon |
|---|---|---|---|
| $C_I$ | 0.0165 | 0.0630 | 0.0060 |
| $C_M$ | 0.999 | 1.010 | 0.900 |
| α | 0.965 | 0.965 | 0.950 |
| β | 0 | 0 | 0 |

Figure 19A:
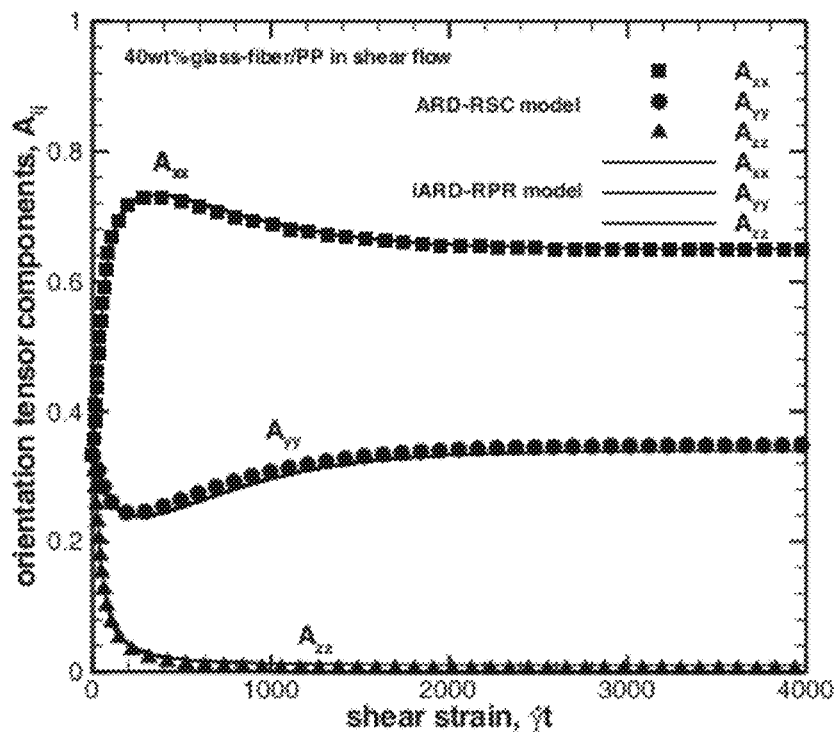
FIG. 19A shows the comparison of the conventional ARD-RSC Model and iARD-RPR Model for prediction of orientation tensor components with respect to shear strain under simple shear flow in different fiber suspensions: 40 wt % glass-fiber/PP.
Figure 19B:
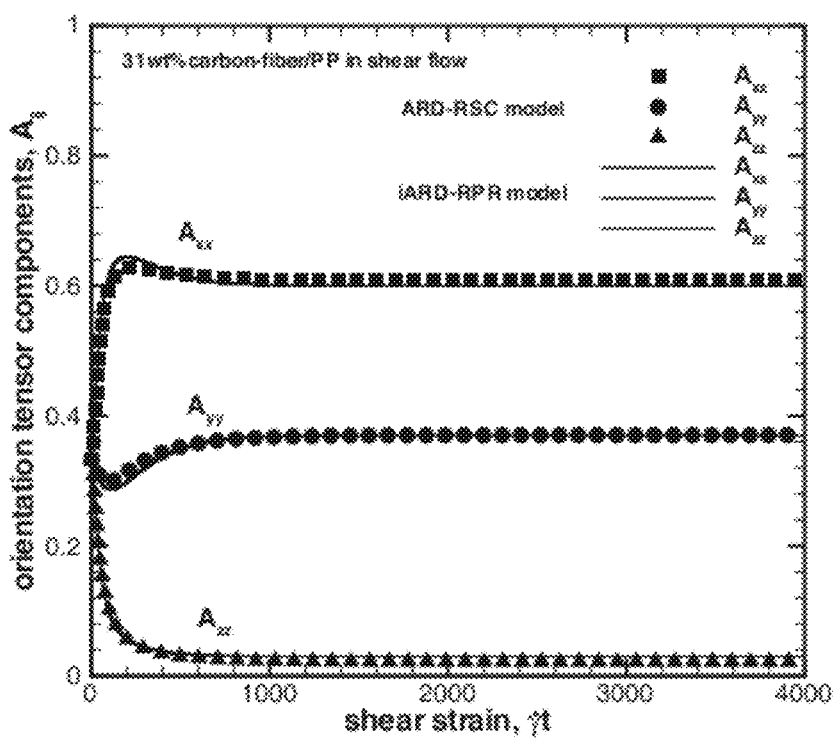
FIG. 19B shows the comparison of the conventional ARD-RSC Model and iARD-RPR Model for prediction of orientation tensor components with respect to shear strain under simple shear flow in different fiber suspensions: 31 wt % carbon-fiber/PP.
Figure 19C:
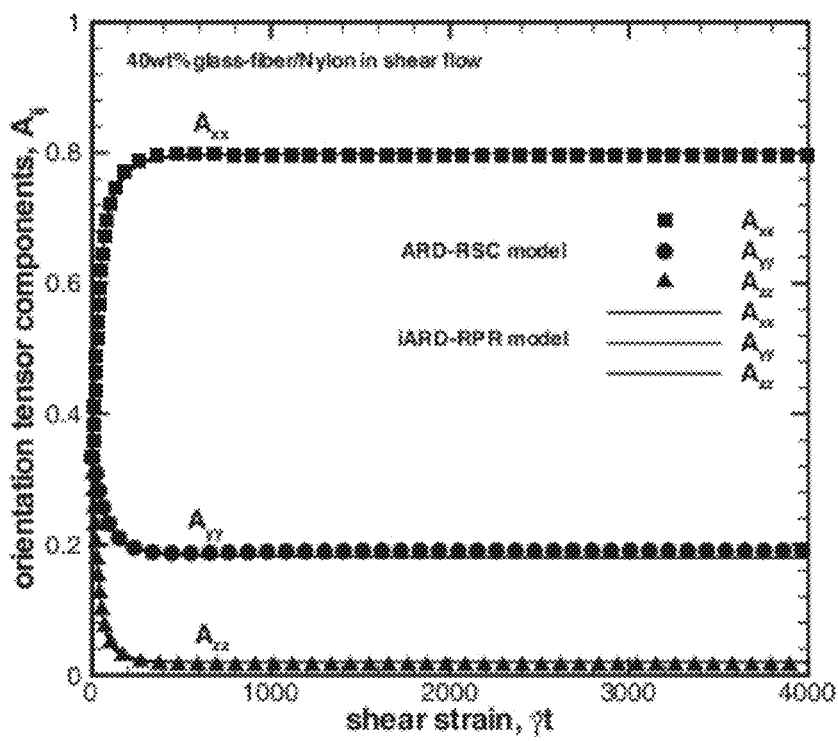
FIG. 19C shows the comparison of the conventional ARD-RSC Model and iARD-RPR Model for prediction of orientation tensor components with respect to shear strain under simple shear flow in different fiber suspensions: 40 wt % glass-fiber/Nylon.

The velocity gradient tensor is the same as above for the simple shear flow with flow direction of x axis, gradient direction of z axis, and neutral to direction of y axis. As a result, for the three sheared anisotropic long fiber suspensions mentioned above, FIG. 19A to FIG. 19C show the change in the attentive tensor components $A_{xx}$, $A_{yy}$, and $A_{zz}$ with respect to shear strain. It is clearly observed that these curves for both models also match each other. This means the iARD Model is in good agreement with the ARD Model for long fibers.

Therefore, the above results firmly support the validity of the iARD-RPR Model. In short, the advantages of the iARD-RPR Model are two-fold: first, for complex flows, parameter β can dominate the detail of the transient orientation; second, these four iARD-RPR parameters are fewer than the six ARD-RSC parameters.

3. Fitting Parameter of iARD-RPR Model

It is important to know the effectiveness of the iARD-RPR Model for fitting the experimental data of the orientation tensor components. The rheological experiments in startup of transient shear flow for short/long fibers immersed in polymer matrix were performed in recent suspension studies. One can obtain the changes in orientation tensor components with respect to shear strain that are from a transient region and follow a steady convergence. In addition, these experimental data are affected by various flexibilities of short fiber and various concentrations of long fiber.

I. Experimental Orientation of Short Fibers

A 30 wt % (volume fraction $\phi=0.1766$) short glass fiber-filled polybutylene terephthalate (PBT) from GE Plastics was used at 228° C. The average aspect ratio of 1000 fibers is $a_r=28.2$ with a diameter of 12.9 μm. The velocity gradient tensor, L, is the simple shear flow with a flow direction of x axis, a gradient direction of z axis, and a neutral direction of y axis. The initial condition of the second orientation tensor is $$A = \begin{bmatrix} 0.517 & 0.075 & 0.058 \\ 0.075 & 0.093 & 0.035 \\ 0.058 & 0.035 & 0.390 \end{bmatrix}. \quad (41)$$

Figure 20:
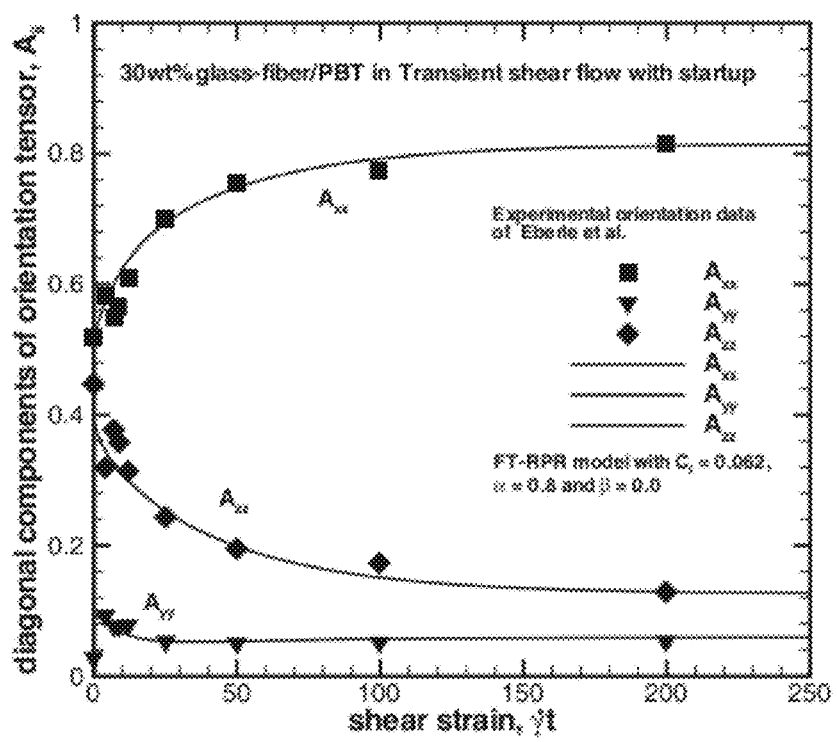
FIG. 20 shows the fitting parameters of the RPR Model for experimental diagonal orientation tensor components with respect to shear strain measured in the 30 wt % glass-fiber/PBT suspension under simple shear flow.

To fit the experimental data of FIG. 20, one can attempt to find the parameters of the iARD-RPR Model. These parameters are listed in Table II below. Notably, the parameter β equals zero due to simple shear flow. The predicted curves of the RPR Model are reasonable to pass through all of the experimental data measured by Eberle et al. (see, A. P. R. Eberle, D. G. Baird, P. Wapperom, and G. M. Vélez-García, "Using transient shear rheology to determine material parameters in fiber suspension theory", J. Rheol. 53, 685 (2009)). This is a rather acceptable outcome.

TABLE II

Parameters of the iARD-RPR Model fitting for experimental orientation tensor components measured by Eberle et al. in short fiber suspension of 30 wt % glass-fiber/PBT under shear.

|   | 30 wt % glass-fiber/PBT |
|---|---|
| $C_I$ | 0.0062 |
| $C_M$ | 0 |
| α | 0.8 |
| β | 0 |

II. Various Flexibilities of Short Fibers

A high viscosity silicone oil of polydimethylsiloxane is selected as the suspending medium. Various fibers are immersed in the silicone oil. Nylon, polyvinyl alcohol (PVA), and Vectran® fibers are referred to as NS, PS, and VS. The flexibility of a fiber can be quantified by the Young modulus $E_Y$. The values of $E_Y$ for NS, PS, and VS are 2, 26, and 76 GPa, respectively. The aspect ratio of these fibers is 70 at the same value. The volume fraction is $\phi=0.03$. The initial condition of the second orientation tensor is:

$$A = \begin{bmatrix} 0.486 & 0 & 0 \\ 0 & 0.1 & 0 \\ 0 & 0 & 0.414 \end{bmatrix} \text{ for } NS, \quad (42)$$

$$A = \begin{bmatrix} 0.496 & 0 & 0 \\ 0 & 0.1 & 0 \\ 0 & 0 & 0.404 \end{bmatrix} \text{ for } PS, \quad (43)$$

$$A = \begin{bmatrix} 0.475 & 0 & 0 \\ 0 & 0.1 & 0 \\ 0 & 0 & 0.425 \end{bmatrix} \text{ for } VS. \quad (44)$$

Figure 21:
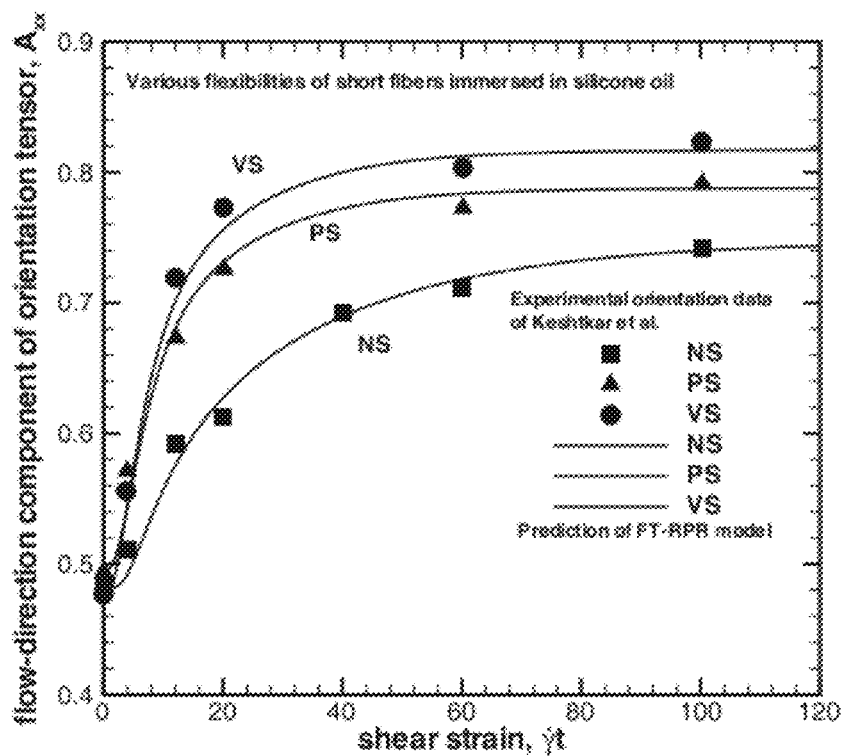
FIG. 21 shows the fitting parameters of the RPR Model for experimental off-diagonal orientation tensor components with respect to shear strain measured at various flexibilities of short fibers immersed in silicone oil under simple shear flow.

Note that the velocity gradient tensor, L, is the simple shear flow with a flow direction of the x axis, a gradient direction of y axis, and a neutral direction of the z axis. Under shear flow with $\dot{\gamma}=1\ s^{-1}$, the diagonal component of the orientation tensor in the flow-direction $A_{xx}$, with respect to various fibers, is exhibited in FIG. 21.

Using the iARD-RPR Model, the parameters can be found with some effort, as shown in the following Table III for NS, PS, and VS fibers. As a result, the predicted curves of the iARD-RPR Model are depicted in the solid lines in FIG. 21. Obviously, the experimental data measured by Keshtkar et al. (see, M. Keshtkar, M.-C. Heuzey, P. J. Carreau, M. Rajabian, and C. Dubois, "Rheological properties and microstructural evolution of semi-flexible fiber suspensions under shear flow", J. Rheol. 54, 197 (2010)) falls on the iARD-RPR curves for almost every fiber. Therefore, the RPR Model is demonstrated as being absolutely unusable for various flexibilities of fiber.

TABLE III

Parameters of the iARD-RPR Model fitting for experimental orientation tensor components measured by Keshtkar et al. at various flexibilities of short fibers immersed in silicone oil under shear. $E_Y$ is the Young modulus.

|   | Nylon (NS) ($E_Y = 2$ GPa) | PVA (PS) ($E_Y = 26$ GPa) | Vectran ® (VS) ($E_Y = 76$ GPa) |
|---|---|---|---|
| $C_I$ | 0.0130 | 0.0085 | 0.0060 |
| $C_M$ | 0 | 0 | 0 |
| α | 0.8 | 0.5 | 0.4 |
| β | 0 | 0 | 0 |

III. Various Concentrations of Long Fibers

Figure 22A:
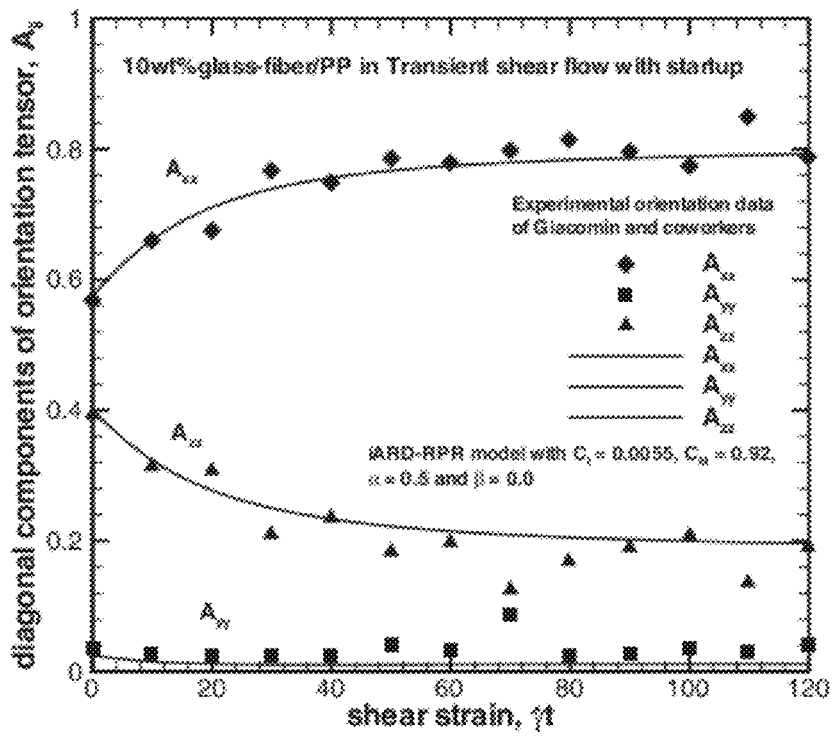
FIG. 22A and FIG. 22B show fitting parameters of the iARD-RPR Model for experimental for diagonal and off-diagonal orientation tensor components with respect to shear strain in the 10 wt % glass-fiber/PP suspension under simple shear flow.
Figure 22B:
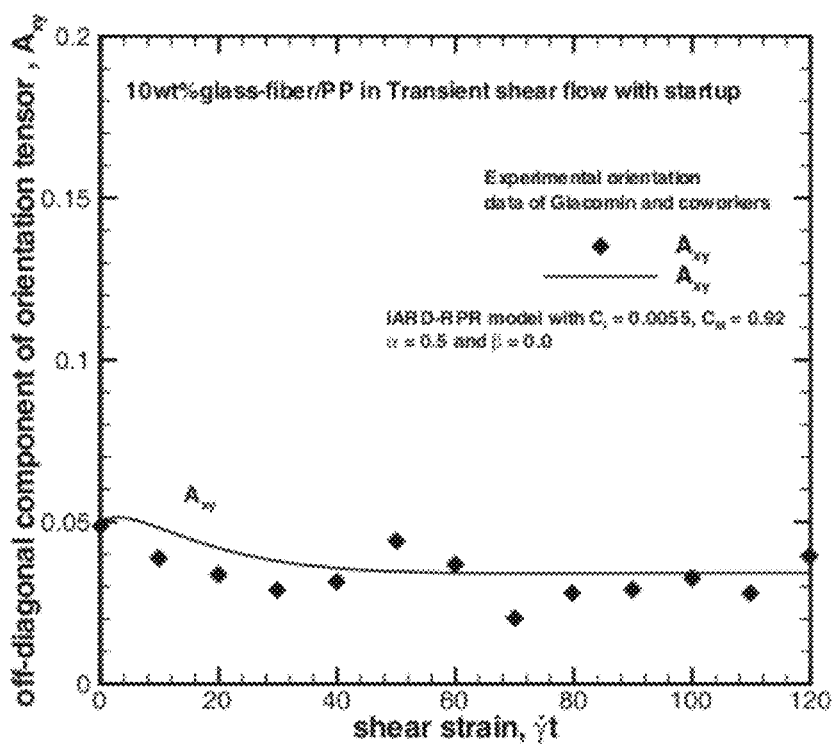
Figure 23A:
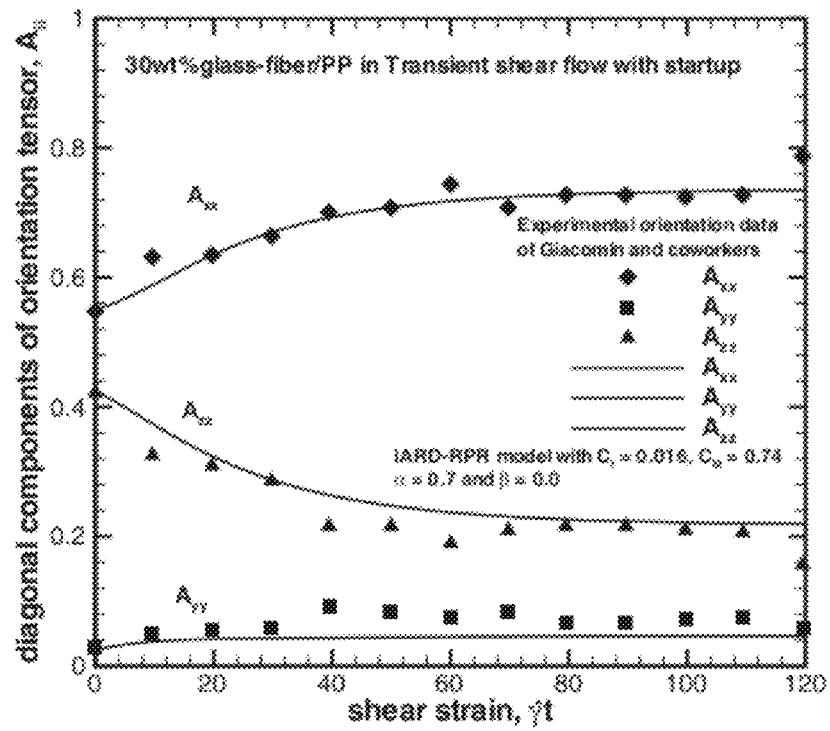
FIG. 23A and FIG. 23B show fitting parameters of the iARD-RPR model for experimental for diagonal and off-diagonal orientation tensor components with respect to shear strain for the 30 wt % glass-fiber/PP suspension under simple shear flow.
Figure 23B:
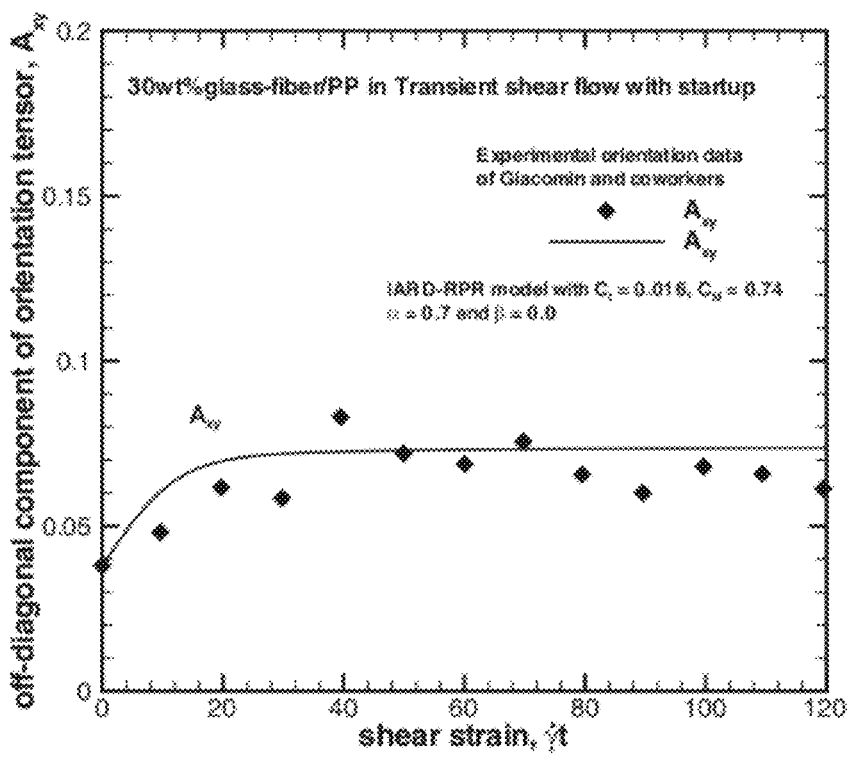

FIG. 22A and FIG. 22B show fitting parameters of the iARD-RPR Model for experimental diagonal and off-diagonal orientation tensor components with respect to shear strain in the 10 wt % glass-fiber/PP suspension under simple shear flow, which were measured by Ortman et al. (see, K. C. Ortman, N. Agarwal, D. G. Baird, P. Wapperom, and A. J. Giacomin, "Transient shear rheology of long glass fiber filled polypropylene using a sliding plate rheometer", presented at the Macromolecules and Interfaces Institute Technical Conference and Review, Blacksburg, Va., USA, 11-13 Oct. 2010). FIG. 23A and FIG. 23B show fitting parameters of the iARD-RPR Model for experimental diagonal and off-diagonal orientation tensor components with respect to shear strain for the 30 wt % glass-fiber/PP suspension under simple shear flow.

The iARD-RPR parameters are listed in Table IV for both fiber concentrations. As shown in FIG. 22A, FIG. 22B, FIG. 23A, and FIG. 23B, the predicted curves of the iARD-RPR Model closely match experimental points, whether dealing with the diagonal or off-diagonal component.

TABLE IV

Parameters of the iARD-RPR Model fitting for experimental orientation tensor components measured by Ortman et al. at various concentrations of a long fiber suspension under shear.

|   | 10 wt % glass-fiber/PP | 30 wt % glass-fiber/PP |
|---|---|---|
| $C_I$ | 0.0055 | 0.0160 |
| $C_M$ | 0.92 | 0.74 |
| α | 0.5 | 0.7 |
| β | 0 | 0 |

4. Application to Injection Molding

Injection molded fiber-reinforced thermoplastics exhibit a distinct shell-core structure. The shell part means that those fibers near the cavity wall are strongly aligned in the flow direction. The core is observed near the cavity center with fiber orientation transverse to the flow. Hence, it is necessary to understand how the fiber orientation varies during mold filling.

Figure 24:
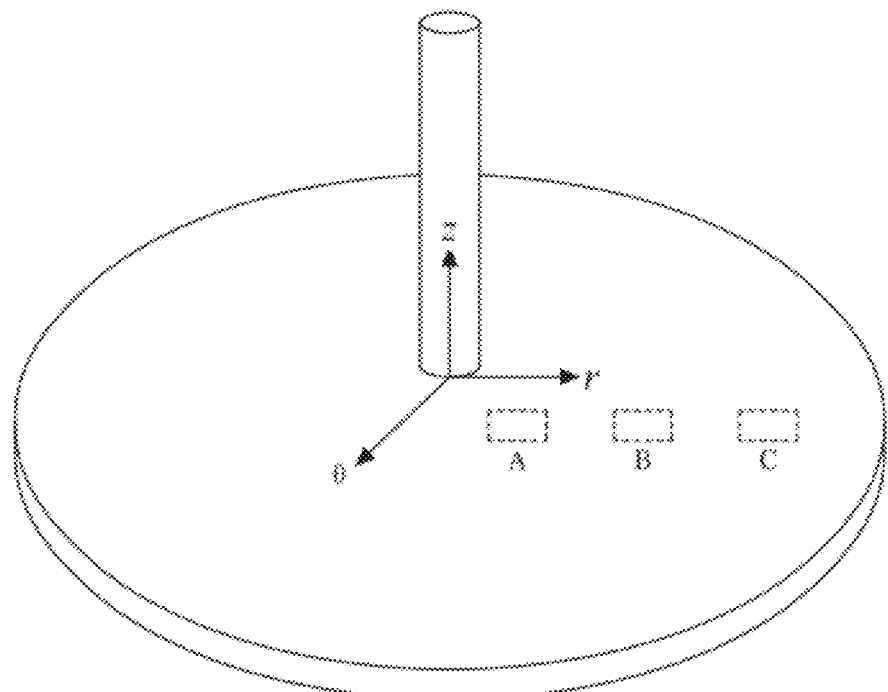
FIG. 24 shows the geometry of center-gated disks of mold filling. Three orientation components of $A_{11}$, $A_{22}$ and $A_{33}$ are measured in three regions of A, B, and C.

A center-gated disk provides a more extensive test of mold filling, as shown in FIG. 24. Here, r describes the flow or radial direction, θ is the cross-flow or tangential direction, and z is the through-thicken direction. The important orientation descriptors are the orientation tensor components: $A_{11}$, $A_{22}$, and $A_{33}$ correspond to the flow, the cross-flow, and the thickness directions, respectively. In general, a high value of $A_{11}$ would indicate a great deal of fibers laying in the flow direction, whereas a near-zero value of $A_{33}$ would indicate little or no orientation in the thickness direction. These fiber orientation data through the thickness is measured at three regions of A, B, and C, along the radial direction of the disk.

The above experimental data of fiber orientation were carried out by PNNL and ORNL using the Leeds image analysis system developed by Hine et al. (see, P. J. Hine, N. Davidson, R. A. Duckett, A. R. Clarke, and I. M. Ward, "Hydrostatically Extruded Glass-Fiber Reinforced Polyoxymethylene. I. The Development of Fiber and Matrix Orientation," Polymer Composites 17, 720 (1996)). Details of the sample preparation and measurement can be found in the published articles of O'Gara et al. (see, J. F. O'Gara, M. G. Wyzgoski, and G. E. Novak, "Development of an ISO Standard for Determining Anisotropic Properties of Glass-Filled Thermoplastics", presented at the Proceedings of the 61th Annual Technical Conference and Exhibition, SPE ANTEC 2003, Nashville, Tenn., U.S.A., May 4-8, 2003).

To discuss the fiber orientation under a condition of a fast filling rate, the iARD-RPR Model is built as a computer program of the dynamic-link library (DLL), and then embedded into a commercial software program for injection molding with a true solid three dimensional (3D) numerical technology, such as Moldex3D, copyrighted by CoreTech System.

I. Short Fibers in Mold Filling

A benchmark test is performed on a resin of polybutylene terephthalate (PBT) blended with 30 wt % short glass fibers during mold filling. This resin is manufactured by General Electric (GE) Plastics under the trade name Valox 420. The average fiber length is 0.3640 mm. This length falls within a range of 0.2 to 0.4 mm and is classed as a short fiber. The average diameter is 12.9 µm. The mold temperature is held to approximately 80° C., while the inlet temperature of the melt is 260° C. The density of glass/PBT material was reported as 1.53 g/cm³. A volume flow rate is 98.1 cm³/s with a filling time of 0.78 s. The iARD-RPR Model's parameters can be listed in the following Table V to predict the orientation of fibers flowing in the disk under mold filling.

TABLE V

Parameters of the iARD-RPR Model at the disk mold filling for the 30 wt % short-glass-fiber/PBT suspension

| | center-gated disk |
|---|---|
| $C_I$ | 0.01 |
| $C_M$ | 0.99 |
| α | 0.1 |
| β | 0.01 |

Figure 25A:
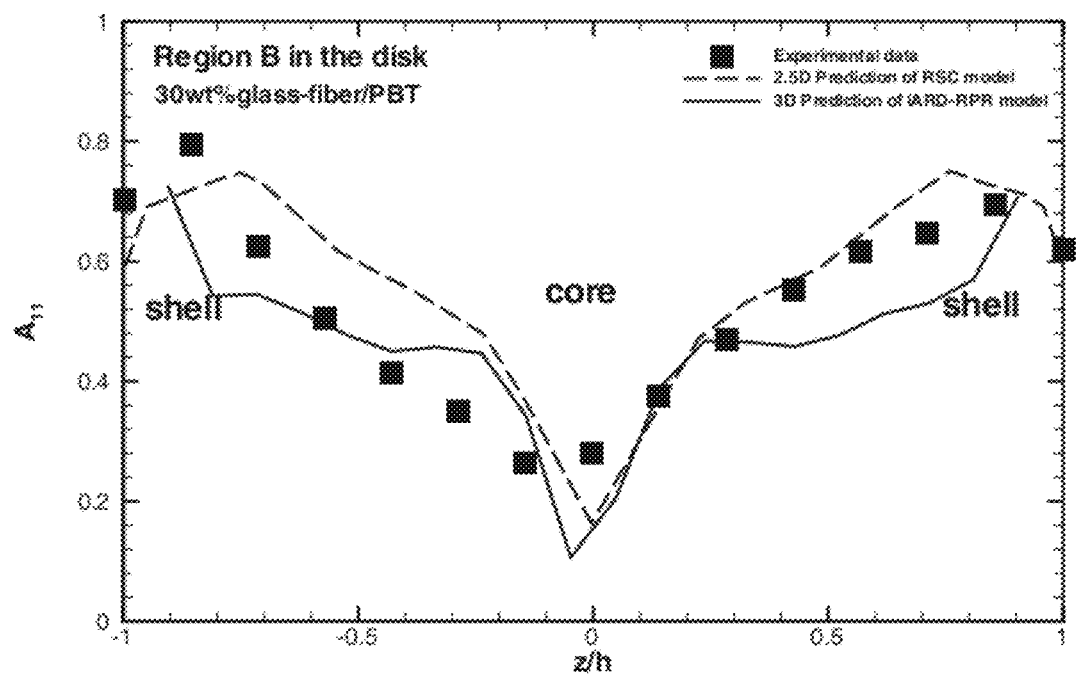
FIG. 25A shows the comparison of the experimental and predicted data of three orientation components, $A_{11}$, through the normalized thickness z/h at Regions B of the center-gated disk for the PBT matrix blended with 30 wt % short glass fibers.
Figure 25B:
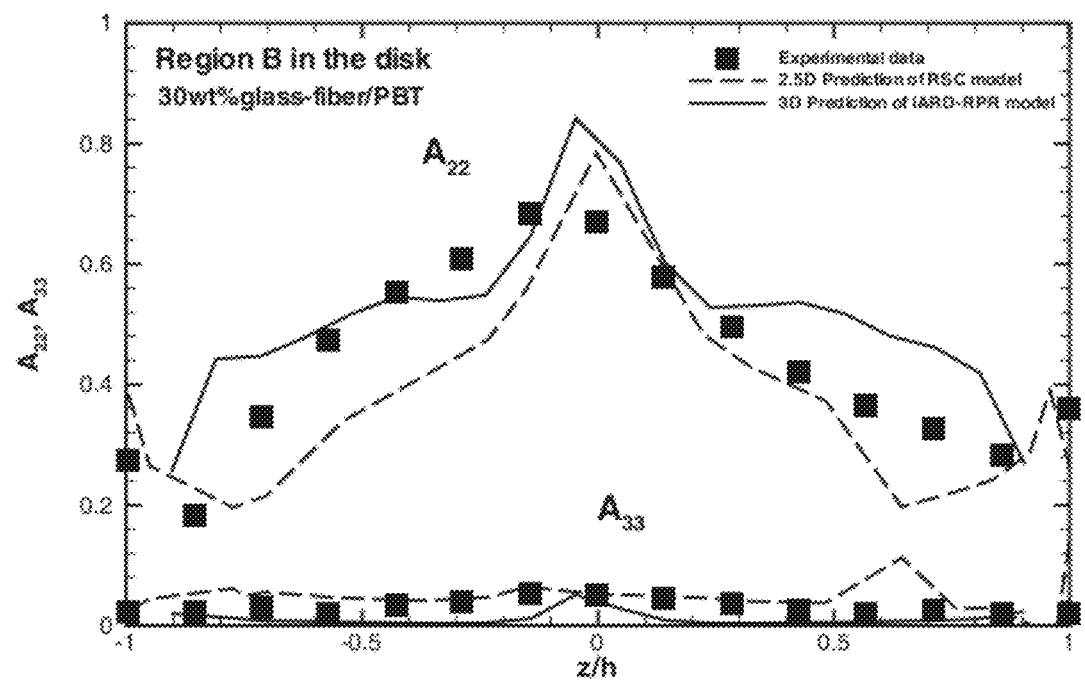
FIG. 25B shows the comparison of the experimental and predicted data of three orientation components, $A_{22}$ and $A_{33}$, through the normalized thickness z/h at Regions B of the center-gated disk for the PBT matrix blended with 30 wt % short glass fibers.
Figure 26A:
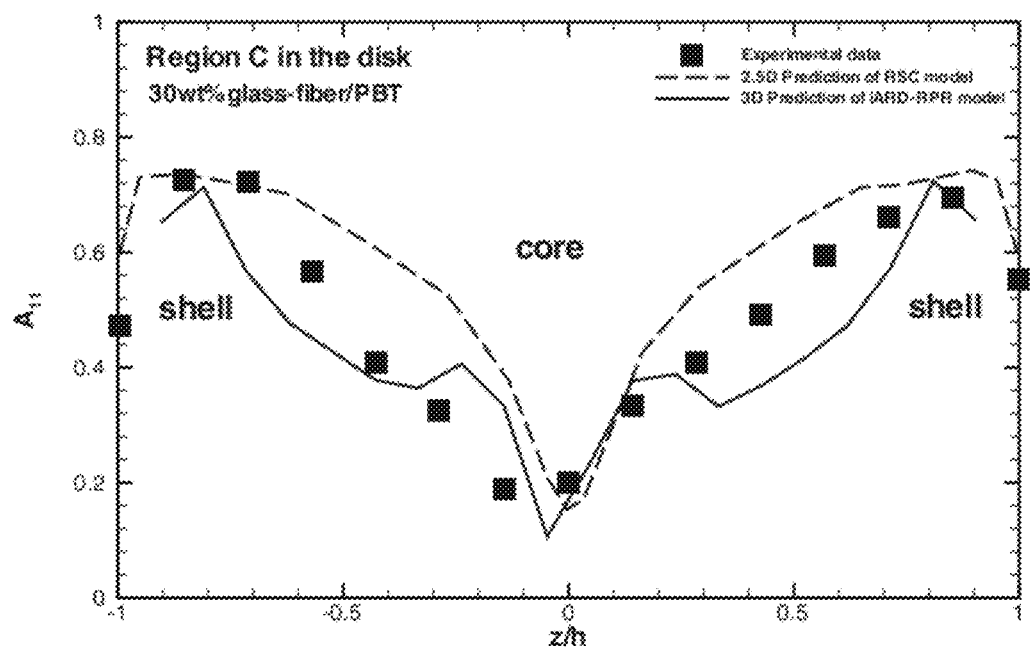
FIG. 26A shows the comparison of the experimental and predicted data of three orientation components, $A_{11}$, through the normalized thickness z/h at Regions C of the center-gated disk for the PBT matrix blended with 30 wt % short glass fibers.
Figure 26B:
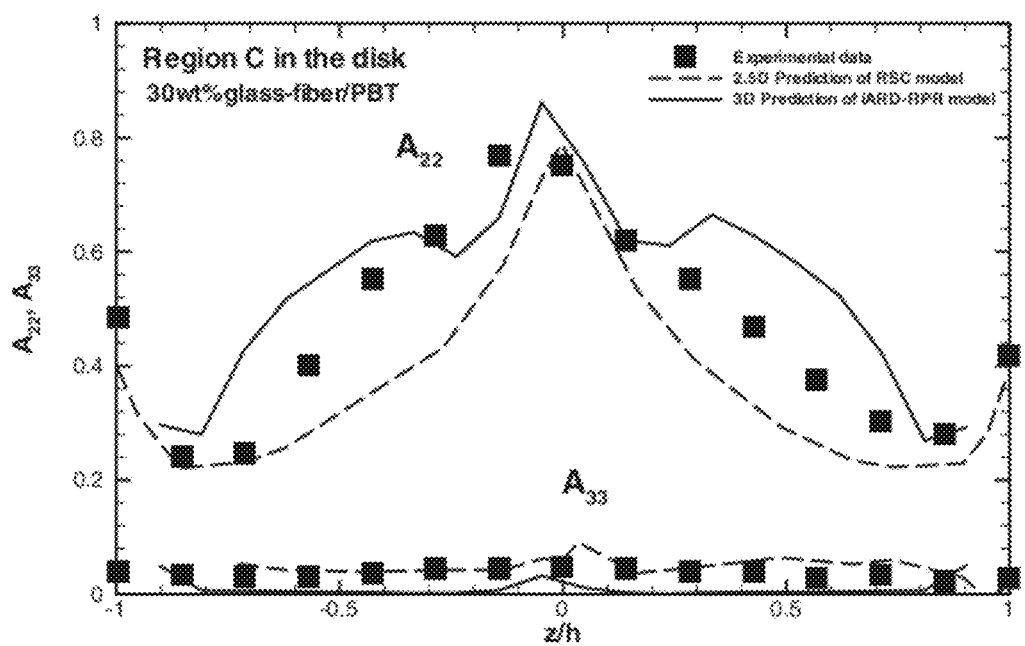
FIG. 26B shows the comparison of the experimental and predicted data of three orientation components, $A_{22}$ and $A_{33}$, through the normalized thickness z/h at Regions C of the center-gated disk for the PBT matrix blended with 30 wt % short glass fibers.
Figure 27A:
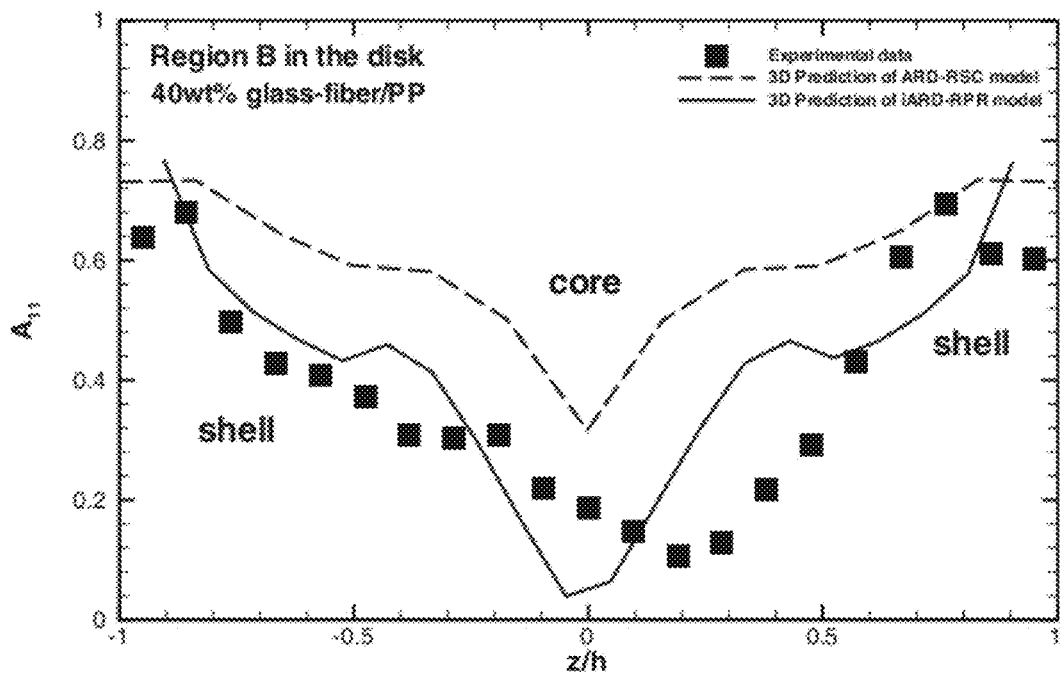
FIG. 27A shows the comparison of the experimental and predicted data of three orientation components, $A_{11}$, through the normalized thickness z/h at Regions B of the center-gated disk for the PP matrix blended with 40 wt % long glass fibers.
Figure 27B:
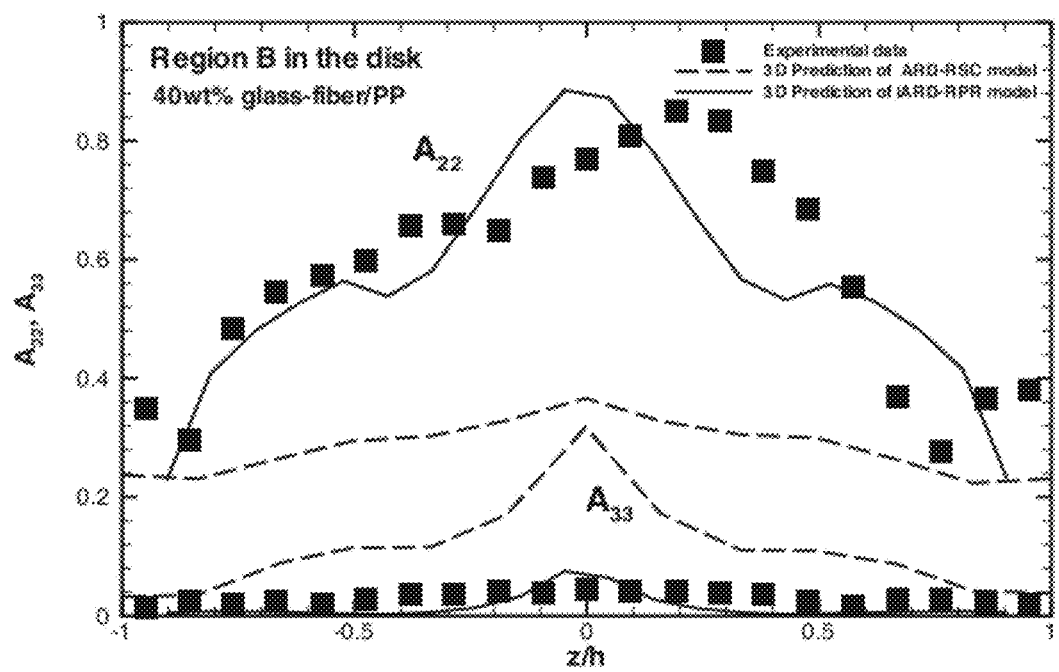
FIG. 27B shows the comparison of the experimental and predicted data of three orientation components, $A_{22}$ and $A_{33}$, through the normalized thickness z/h at Regions B of the center-gated disk for the PP matrix blended with 40 wt % long glass fibers.
Figure 28A:
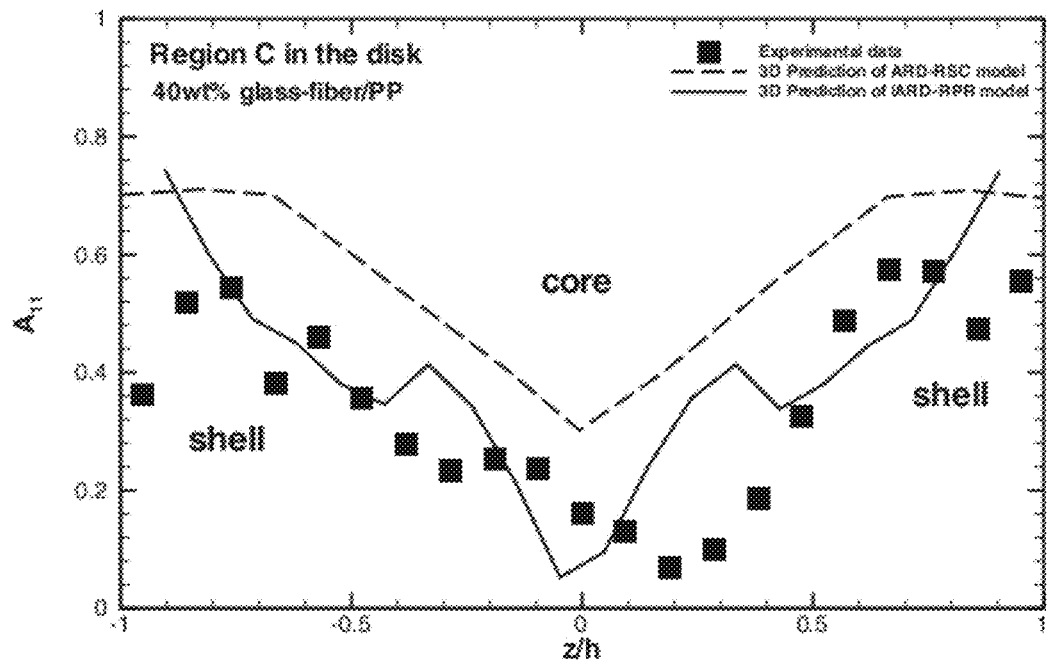
FIG. 28A shows the comparison of the experimental and predicted data of three orientation components, $A_{11}$, through the normalized thickness z/h at Regions C of the center-gated disk for the PP matrix blended with 40 wt % long glass fibers.
Figure 28B:
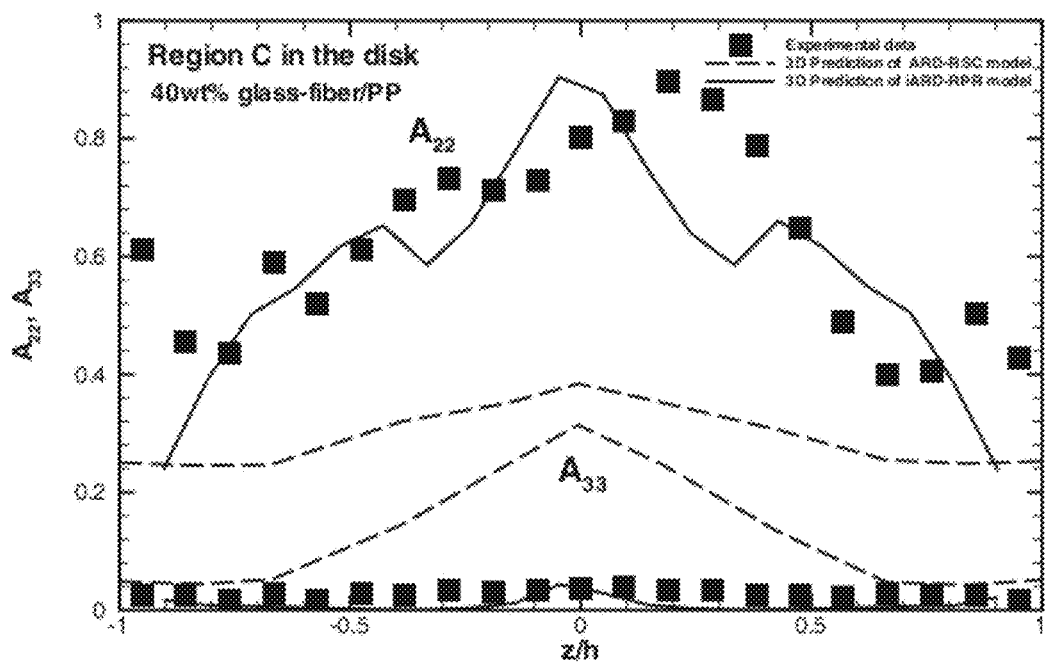
FIG. 28B shows the comparison of the experimental and predicted data of three orientation components, $A_{22}$ and $A_{33}$, through the normalized thickness z/h at Regions C of the center-gated disk for the PP matrix blended with 40 wt % long glass fibers.

The radius of the disk is 90 mm with a thickness of 2 h=3 mm. The A, B, and C regions are located at 0, 60, and 60 mm in the radial direction, respectively. The predicted orientation data was computed for 20 slices across the thickness of the disk. Difference is presented among the RSC Model and the iARD-RPR Model for the prediction of fiber orientation, as compared with experimental data. FIG. 25A and FIG. 25B show these orientation distributions through the normalized thickness z/h obtained in the region B, and FIG. 26A and FIG. 26B show these orientation distributions through the normalized thickness obtained in the regions C, wherein the dash line and solid line plotted in the figures indicates ARD-RSC Model and the iARD-RPR Model, respectively. Note that there is no experimental data in Region A.

The flow orientation component $A_{11}$ exhibits the typical shell-core-shell structure through the thickness. The $A_{11}$ component is small near the center, which means fibers transversely aligned. This is called the core due to strong stretching. The shell structure is defined on both sides of the core structure with large value of the $A_{11}$ component. This means the fibers are aligned due to strong shearing.

Using the 3D numerical technology of Moldex3D software combined with the iARD-RPR Model, all of the $A_{11}$ components in two regions are close to the experimental points through the thickness, whether the core or the shell. Also, the predicted cross-flow and thickness directional components, $A_{22}$ and $A_{33}$ are almost in good agreement with their corresponding experimental data. Obviously, the application of iARD-RPR Model to predict orientation of fibers in injection molding is superior.

Wang et al. (see, J. Wang, Ph.D. Thesis, University of Illinois at Urbana-Champaign, 2007) developed the RSC Model combined with ORIENT code, which is a 2.5D numerical technology of the finite difference program developed by the University of Illinois of Professor Tucker. Also, a good prediction result can be obtained of those orientation components, as shown in the dashed lines of FIG. 25 and FIG. 26.

II. Long Fibers in Mold Filling

A benchmark test of long fibers flowing during mold filling is conducted. The density of glass-fiber/polypropylene (PP) material was reported as 1.22 g/cm³ with a fiber weight fraction of 40%. The material is called MT1-PP40G, provided by Montsinger Technologies, Inc. The averaged glass fiber diameter is about 17.4 µm. The number average fiber length is about 13 mm. The post-extruded average fiber length is about 2.87 mm. Such a longer length than 1 mm is generally considered as long fibers. The mold temperature was held to approximately 70° C., while the inlet temperature was 238° C. A volume flow rate is 118.32 cm³/s with a filling time of 0.65 s. Note that the disk is 177.8 mm in diameter with a thickness of 2 h=3 mm. The Regions A, B, and C are located at 6, 34, and 64 mm in the radial direction, respectively. The iARD-RPR Model's parameters for the long fibers flowing in the disk mold are listed in Table VI.

TABLE VI

Parameters of the iARD-RPR Model at the disk mold filling for the 40 wt % long-glass-fiber/PP suspension

| | center-gated disk |
|---|---|
| $C_I$ | 0.005 |
| $C_M$ | 0.999 |
| α | 0.01 |
| β | 0.1 |

As already discussed for the mold filling of short fibers, FIG. 27A, FIG. 27B, FIG. 28A, and FIG. 28B show the prediction of those orientation distributions through the normalized thickness obtained from two regions B and C marked in the disk, respectively; wherein the dash line and solid line plotted in the figures indicates ARD-RSC Model and the iARD-RPR Model, respectively. As compared with experimental values (square symbols) in all the studied samples, the prediction of fiber orientation by the iARD-RPR Model is obviously superior to the ARD-RSC Model. Overall, the iARD-RPR 3D results are reasonable.

The 3D fiber orientation prediction results of the ARD-RSC Model can be referred in the PNNL report (see, N. Nguyen, X. Jin, J. Wang, J. H. Phelps, C. L. T. III, V. Kunc, S. K. Bapanapalli, and M. T. Smith, "Implementation of New Process Models for Tailored Polymer Composite Structures into Processing Software Packages", the U.S. Department of Energy, Pacific Northwest National Laboratory, under Contract DE-AC05-76RL01830 (2010)). As a comparison in other regions, it is clear that the $A_{11}$ and $A_{33}$ component is over-predicted, whereas the $A_{22}$ component is under-predicted. Due to the nature of the RSC and ARD-RSC Models, their conclusions explained that "the inlet condition of orientation tensor" and "the calculation accuracy of velocity gradient tensor" strongly influenced the fiber orientation prediction. However, the ARD-RSC 3D results do not agree with the experimental, but the 2.5D results is reasonable.

5. Summary

The ultimate goal of the present invention for non-dilute suspension flows of rigid fibers immersed in a polymer fluid, which underlies the proposed iARD-RPR Model, is to predict fiber orientation. The overall predictions of fiber orientation obtained by using this new model are in acceptable agreement with related experimental measurements. As an application to injection molding, through thickness, the tendency to vary of the fiber orientation is the same no matter how the short or long fiber suspension, namely, a feature of the shell-core-shell structure.

One can inspect that a somewhat difference between the predicted values by the iARD-RPR Model and the experimental data is almost acceptable than the standard Folgar-Tucker Model and the ARD-RSC Model. Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A computer-implemented method for determining orientation of fibers in a fluid having polymer chains, comprising a step of calculating using a computer processor the orientation of the fibers by taking into consideration an interaction between the fibers and the fluid, wherein the interaction between the fibers and the fluid comprises changes in configuration of the polymer chain to cause the entanglement or adsorption between the fibers and the polymer chains;

wherein the interaction is represented using an expression:

$$\left(\frac{d\psi}{dt}\right)^{IOK} = -k\psi;$$

$$k = (pp)^{-1} : \left(\frac{dpp}{dt}\right)^{IOK};$$

wherein $\psi$ represents a probability density function of aligned fibers;

$$\left[\frac{d\psi}{dt}\right]^{IOK}$$

represents a change in the probability density function of the aligned fibers decaying with respect to time; k represents a characteristic constant of the interaction between the fibers and the fluid; pp represents orientation tensor of a fiber; $(pp)^{-1}$ represents inverse of orientation tensor pp; and $$\left[\frac{dpp}{dt}\right]^{IOK}$$

represents a change in orientation tensor pp with respect to time.

2. The computer-implemented method according to claim 1, further taking into consideration a steric barrier effect on a rotary movement of the fibers.

3. The computer-implemented method according to claim 2, wherein the steric barrier effect on the rotary movement of the fibers is represented using an expression:

$$D_r = f(\tilde{L});$$

$$\tilde{L} = \frac{L^T \cdot L}{L^T : L};$$

wherein $D_r$ represents an anisotropic rotary diffusion tensor; $\tilde{L}$ represents a second order symmetric tensor with its trace($\tilde{L}$)=1; L represents a velocity gradient tensor; $f(\tilde{L})$ represents a function of the tensor $\tilde{L}$; and $L^T$ represents a transpose matrix of the velocity gradient tensor L.

4. The computer-implemented method according to claim 2, wherein the steric barrier effect on the rotary movement of the fibers is represented using an expression:

$$D_r = D_0(I - C_M \tilde{L});$$

$$\tilde{L} = \frac{L^T \cdot L}{L^T : L};$$

wherein $D_r$ represents an anisotropic rotary diffusion tensor; $D_0$ represents a rotary diffusion parameter indicative of fiber-fiber interactions; $C_M$ represents a steric mobile barrier parameter of the fiber embedded in the fluid; I represents an identity matrix; $\tilde{L}$ represents a second order symmetric tensor with its trace($\tilde{L}$)=1; L represents a velocity gradient tensor; and $L^T$ represents a transpose matrix of the velocity gradient tensor L.

5. A computer-implemented method for determining orientation of fibers in a fluid having polymer chains, comprising a step of calculating using a computer processor the orientation of the fibers by taking into consideration an interaction between the fibers and the fluid, wherein the interaction between the fibers and the fluid comprises changes in configuration of the polymer chain to cause the entanglement or adsorption between the fibers and the polymer chains;

wherein the interaction is represented using an expression:

$$\dot{\Lambda}^{RPR} = -R \cdot \dot{\Lambda}^{IOK} \cdot R^t;$$

wherein $\dot{\Lambda}^{RPR}$ represents the interaction; R represents a rotation matrix; $R^t$ represents a transpose matrix of the rotation matrix R; $\Lambda$ represents a diagonal tensor of a orientation tensor of fibers A; $\dot{\Lambda}^{IOK}$ represents a rate of the diagonal tensor with respect to time; $e_1$, $e_2$, and $e_3$ represent eigenvectors of the orientation tensor A; and the rotation matrix R is given by the eigenvectors, R=[$e_1$, $e_2$,$e_3$].

6. The computer-implemented method according to claim 5, wherein diagonal components of the $\dot{\Lambda}^{IOK}$ are represented using an expression:

$$\dot{\Lambda}_{ii}^{IOK} = f(\dot{\lambda}_1, \dot{\lambda}_2, \dot{\lambda}_3);$$

$$\begin{bmatrix} \dot{\lambda}_1 & 0 & 0 \\ 0 & \dot{\lambda}_2 & 0 \\ 0 & 0 & \dot{\lambda}_3 \end{bmatrix} = R^t \cdot \dot{A} \cdot R;$$

wherein $\dot{\Lambda}_{ii}^{IOK}$ represents the i-th diagonal components of the $\dot{\Lambda}^{IOK}$; $\dot{\lambda}_1$, $\dot{\lambda}_2$, and $\dot{\lambda}_3$ represents a rate of eigenvalues of orientation tensor A; $f(\dot{\lambda}_1,\dot{\lambda}_2,\dot{\lambda}_3)$ represents a function of $\dot{\lambda}_1$, $\dot{\lambda}_2$, and $\dot{\lambda}_3$; and $\dot{A}$ represents a rate of the orientation tensor A with respect to time, the $\dot{A}$ including the hydrodynamics term and the rotary diffusion term of the fibers.

7. The computer-implemented method according to claim 5, wherein diagonal components of the $\dot{\Lambda}^{IOK}$ are represented using an expression:

$$\dot{\Lambda}_{ii}^{IOK} = \alpha[\dot{\lambda}_i - \beta(\dot{\lambda}_i^2 + 2\dot{\lambda}_j \dot{\lambda}_k)], i,j,k=1,2,3;$$

wherein $\dot{\Lambda}_{ii}^{IOK}$ represents the i-th diagonal components of the tensor $\dot{\Lambda}^{IOK}$; i, j, and k represent indexes of permutation; $\alpha$ and $\beta$ represent parameters; and $\dot{\lambda}_1$, $\dot{\lambda}_2$, and $\dot{\lambda}_3$ represents a rate of eigenvalues of the orientation tensor A.

8. The computer-implemented method according to claim 5, wherein diagonal components of the $\dot{\Lambda}^{IOK}$ are represented using an expression:

$$\dot{\Lambda}_{ii}^{IOK} = \omega_i \dot{\lambda}_i, i=1,2,3;$$

$$\omega_2 \dot{\lambda}_2 = -(\omega_1 \dot{\lambda}_1 + \omega_3 \dot{\lambda}_3);$$

wherein $\dot{\Lambda}_{ii}^{IOK}$ represents the i-th diagonal components of the tensor $\dot{\Lambda}^{IOK}$; $\omega_1$, $\omega_2$, and $\omega_3$ represents scalar factors to scale a rate of eigenvalues of the orientation tensor A, $\dot{\lambda}_1$, $\dot{\lambda}_2$, and $\dot{\lambda}_3$, respectively.

9. The computer-implemented method according to claim 5, further taking into consideration a steric barrier effect on a rotary movement of the fibers.

10. The computer-implemented method according to claim 9, wherein the steric barrier effect on the rotary movement of the fibers is represented using an expression:

$$D_r = f(\tilde{L});$$

$$\tilde{L} = \frac{L^T \cdot L}{L^T : L};$$

wherein $D_r$ represents an anisotropic rotary diffusion tensor; $\tilde{L}$ represents a second order symmetric tensor with its trace($\tilde{L}$)=1; L represents a velocity gradient tensor; $f(\tilde{L})$ represents a function of the tensor $\tilde{L}$; and $L^T$ represents a transpose matrix of the velocity gradient tensor L.

11. The computer-implemented method according to claim 9, wherein the steric barrier effect on the rotary movement of the fibers is represented using an expression:

$$D_r = D_0(I - C_M \tilde{L});$$

$$\tilde{L} = \frac{L^T \cdot L}{L^T : L};$$

wherein $D_r$ represents an anisotropic rotary diffusion tensor; $D_0$ represents a rotary diffusion parameter indicative of fiber-fiber interactions; $C_M$ represents a steric mobile barrier parameter of the fiber embedded in the fluid; I represents an identity matrix; $\tilde{L}$ represents a second order symmetric tensor with its trace($\tilde{L}$)=1; L represents a velocity gradient tensor; and $L^T$ represents a transpose matrix of the velocity gradient tensor L.

12. A computer-implemented method for determining orientation of fibers in a fluid having polymer chains, the fibers in the fluid including a transitional movement and a rotatary movement, the method comprising a step of calculating using a computer processor the orientation of the fibers by taking into consideration a steric barrier effect on a rotary movement of the fibers;

wherein the steric barrier effect on the rotary movement of the fibers is represented using an expression:

$$D_r = f(\tilde{L});$$

$$\tilde{L} = \frac{L^T \cdot L}{L^T : L};$$

wherein $D_r$ represents an anisotropic rotary diffusion tensor; $\tilde{L}$ represents a second order symmetric tensor with its trace($\tilde{L}$)=1; L represents a velocity gradient tensor; $f(\tilde{L})$ represents a function of the tensor $\tilde{L}$; and $L^T$ represents a transpose matrix of the velocity gradient tensor L.

13. A computer-implemented method for determining orientation of fibers in a fluid having polymer chains, the fibers in the fluid including a transitional movement and a rotatary movement, the method comprising a step of calculating using a computer processor the orientation of the fibers by taking into consideration a steric barrier effect on a rotary movement of the fibers;

wherein the steric barrier effect on the rotary movement of the fibers is represented using an expression:

$$D_r = D_0(I - C_M \tilde{L});$$

$$\tilde{L} = \frac{L^T \cdot L}{L^T : L};$$

wherein $D_r$ represents an anisotropic rotary diffusion tensor; $D_0$ represents a rotary diffusion parameter indicative of fiber-fiber interactions; $C_M$ represents a steric mobile barrier parameter of the fiber embedded in the fluid; I represents an identity matrix; $\tilde{L}$ represents a second order symmetric tensor with its trace($\tilde{L}$)=1; L represents a velocity gradient tensor; and $L^T$ represents a transpose matrix of the velocity gradient tensor L.

14. A non-transitory computer medium containing computer instructions stored therein for causing a computer processor to perform operations for determining orientation of fibers in a fluid having polymer chains, the operations comprising a step of calculating the orientation of the fibers by taking into consideration an interaction between the fibers and the fluid, wherein the interaction between the fibers and the fluid comprises changes in configuration of the polymer chain to cause the entanglement or adsorption between the fibers and the polymer chains;

wherein the interaction is represented using an expression:

$$\left(\frac{d\psi}{dt}\right)^{IOK} = -k\psi;$$

$$k = (pp)^{-1} \cdot \left(\frac{dpp}{dt}\right)^{IOK};$$

wherein $\psi$ represents a probability density function of aligned fibers;

$$\left[\frac{d\psi}{dt}\right]^{IOK}$$

represents a change in the probability density function of the aligned fibers decaying with respect to time; k represents a characteristic constant of the interaction between the fibers and the fluid; pp represents orientation tensor of a fiber; $(pp)^{-1}$ represents inverse of orientation tensor pp; and $$\left[\frac{dpp}{dt}\right]^{IOK}$$

represents a change in orientation tensor pp with respect to time.

15. The non-transitory computer medium according to claim 14, wherein the operations further comprising a step of taking into consideration a steric barrier effect on a rotary movement of the fibers.

16. The non-transitory computer medium according to claim 15, wherein the steric barrier effect on the rotary movement of the fibers is represented using an expression:

$$D_r = f(\tilde{L});$$

$$\tilde{L} = \frac{L^T \cdot L}{L^T : L};$$

wherein $D_r$ represents an anisotropic rotary diffusion tensor; $\tilde{L}$ represents a second order symmetric tensor with its trace($\tilde{L}$)=1; L represents a velocity gradient tensor; $f(\tilde{L})$ represents a function of the tensor $\tilde{L}$; and $L^T$ represents a transpose matrix of the velocity gradient tensor L.

17. The non-transitory computer medium according to claim 15, wherein the steric barrier effect on the rotary movement of the fibers is represented using an expression:

$$D_r = D_0(I - C_M \tilde{L});$$

$$\tilde{L} = \frac{L^T \cdot L}{L^T : L};$$

wherein $D_r$ represents an anisotropic rotary diffusion tensor; $D_0$ represents a rotary diffusion parameter indicative of fiber-fiber interactions; $C_M$ represents a steric mobile barrier parameter of the fiber embedded in the fluid; I represents an identity matrix; $\tilde{L}$ represents a second order symmetric tensor with its trace($\tilde{L}$)=1; L represents a velocity gradient tensor; and $L^T$ represents a transpose matrix of the velocity gradient tensor L.

18. A non-transitory computer medium containing computer instructions stored therein for causing a computer processor to perform operations for determining orientation of fibers in a fluid having polymer chains, the operations comprising a step of calculating the orientation of the fibers by taking into consideration an interaction between the fibers and the fluid, wherein the interaction between the fibers and the fluid comprises changes in configuration of the polymer chain to cause the entanglement or adsorption between the fibers and the polymer chains;

wherein the interaction is represented using an expression:

$$\dot{A}^{RPR} = -R \cdot \dot{\Lambda}^{IOK} \cdot R^t;$$

wherein $\dot{A}^{RPR}$ represents the interaction; R represents a rotation matrix; $R^t$ represents a transpose matrix of the rotation matrix R; $\Lambda$ represents a diagonal tensor of a orientation tensor of fibers A; $\dot{\Lambda}^{IOK}$ represents a rate of the diagonal tensor with respect to time; $e_1$, $e_2$, and $e_3$ represent eigenvectors of the orientation tensor A; and the rotation matrix R is given by the eigenvectors, R=[$e_1$, $e_2$,$e_3$].

19. The non-transitory computer medium according to claim 18, wherein diagonal components of the $\dot{\Lambda}^{IOK}$ are represented using an expression:

$$\dot{\Lambda}_{ii}^{IOK} = f(\dot{\lambda}_1, \dot{\lambda}_2, \dot{\lambda}_3);$$

$$\begin{bmatrix} \dot{\lambda}_1 & 0 & 0 \\ 0 & \dot{\lambda}_2 & 0 \\ 0 & 0 & \dot{\lambda}_3 \end{bmatrix} = R^t \cdot \dot{A} \cdot R;$$

wherein $\dot{\Lambda}_{ii}^{IOK}$ represents the i-th diagonal components of the $\dot{\Lambda}^{IOK}$; $\dot{\lambda}_1$, $\dot{\lambda}_2$, and $\dot{\lambda}_3$ represents a rate of eigenvalues of orientation tensor A; $f(\dot{\lambda}_1,\dot{\lambda}_2,\dot{\lambda}_3)$ represents a function of $\dot{\lambda}_1$, $\dot{\lambda}_2$, and $\dot{\lambda}_3$; and $\dot{A}$ represents a rate of the orientation tensor A with respect to time, the $\dot{A}$ including the hydrodynamics term and the rotary diffusion term of the fibers.

20. The non-transitory computer medium according to claim 18, wherein diagonal components of the $\dot{\Lambda}^{IOK}$ are represented using an expression:

$$\dot{\Lambda}_{ii}^{IOK} = \alpha[\dot{\lambda}_i - \beta^*\dot{\lambda}_i^2 + 2\dot{\lambda}_j\dot{\lambda}_k)], i,j,k=1,2,3;$$

wherein $\dot{\Lambda}_{ii}^{IOK}$ represents the i-th diagonal components of the tensor $\dot{\Lambda}^{IOK}$; i, j, and k represent indexes of permutation; α and β represent parameters; and $\dot{\lambda}_1$, $\dot{\lambda}_2$, and $\dot{\lambda}_3$ represents a rate of eigenvalues of the orientation tensor A.

21. The non-transitory computer medium according to claim 18, wherein diagonal components of the $\dot{\Lambda}^{IOK}$ are represented using an expression:

$$\dot{\lambda}_{ii}^{IOK} = \omega_i \dot{\lambda}_{ii}, i=1,2,3;$$

$$\omega_2 \dot{\lambda}_2 = -(\omega_1 \dot{\lambda}_1 + \omega_3 \dot{\lambda}_3);$$

wherein $\dot{\Lambda}_{ii}^{IOK}$ represents the i-th diagonal components of the tensor $\dot{\Lambda}^{IOK}$; $\omega_1$, $\omega_2$ and $\omega_3$ represents scalar factors to scale a rate of eigenvalues of the orientation tensor A, $\dot{\lambda}_1$, $\dot{\lambda}_2$, and $\dot{\lambda}_3$, respectively.

22. The non-transitory computer medium according to claim 18, further taking into consideration a steric barrier effect on a rotary movement of the fibers.

23. The non-transitory computer medium according to claim 22, wherein the steric barrier effect on the rotary movement of the fibers is represented using an expression:

$$D_r = f(\tilde{L});$$

$$\tilde{L} = \frac{L^T \cdot L}{L^T : L};$$

wherein $D_r$ represents an anisotropic rotary diffusion tensor; $\tilde{L}$ represents a second order symmetric tensor with its trace($\tilde{L}$)=1; L represents a velocity gradient tensor; $f(\tilde{L})$ represents a function of the tensor $\tilde{L}$; and $L^T$ represents a transpose matrix of the velocity gradient tensor L.

24. The non-transitory computer medium according to claim 22, wherein the steric barrier effect on the rotary movement of the fibers is represented using an expression:

$$D_r = D_0(I - C_M \tilde{L});$$

$$\tilde{L} = \frac{L^T \cdot L}{L^T : L};$$

wherein $D_r$ represents an anisotropic rotary diffusion tensor; $D_0$ represents a rotary diffusion parameter indicative of fiber-fiber interactions; $C_M$ represents a steric mobile barrier parameter of the fiber embedded in the fluid; I represents an identity matrix; $\tilde{L}$ represents a second order symmetric tensor with its trace($\tilde{L}$)=1; L represents a velocity gradient tensor; and $L^T$ represents a transpose matrix of the velocity gradient tensor L.

25. A non-transitory computer medium containing computer instructions stored therein for causing a computer processor to perform operations for determining orientation of fibers in a fluid having polymer chains, the fibers in the fluid including a transitional movement and a rotatary movement, the operations comprising a step of calculating the orientation of the fibers is performed by taking into consideration a steric barrier effect on a rotary movement of the fibers; wherein the steric barrier effect on the rotary movement of the fibers is represented using an expression:

$$D_r = f(\tilde{L});$$

$$\tilde{L} = \frac{L^T \cdot L}{L^T : L};$$

wherein $D_r$ represents an anisotropic rotary diffusion tensor; $\tilde{L}$ represents a second order symmetric tensor with its trace($\tilde{L}$)=1; L represents a velocity gradient tensor; $f(\tilde{L})$ represents a function of the tensor $\tilde{L}$; and $L^T$ represents a transpose matrix of the velocity gradient tensor L.

26. A non-transitory computer medium containing computer instructions stored therein for causing a computer processor to perform operations for determining orientation of fibers in a fluid having polymer chains, the fibers in the fluid including a transitional movement and a rotatary movement, the operations comprising a step of calculating the orientation of the fibers is performed by taking into consideration a steric barrier effect on a rotary movement of the fibers; wherein the steric barrier effect on the rotary movement of the fibers is represented using an expression:

$$D_r = D_0(I - C_M \tilde{L});$$

$$\tilde{L} = \frac{L^T \cdot L}{L^T : L};$$

wherein $D_r$ represents an anisotropic rotary diffusion tensor; $D_0$ represents a rotary diffusion parameter indicative of fiber-fiber interactions; $C_M$ represents a steric mobile barrier parameter of the fiber embedded in the fluid; I represents an identity matrix; $\tilde{L}$ represents a second order symmetric tensor with its trace($\tilde{L}$)=1; L represents a velocity gradient tensor; and $L^T$ represents a transpose matrix of the velocity gradient tensor L.

* * * * *